United States Patent
Watatani et al.

(10) Patent No.: US 10,822,276 B2
(45) Date of Patent: Nov. 3, 2020

(54) OXIDE SINTERED MATERIAL AND METHOD OF MANUFACTURING THE SAME, SPUTTERING TARGET, AND METHOD OF MANUFACTURING SEMICONDUCTOR DEVICE

(71) Applicant: Sumitomo Electric Industries, Ltd., Osaka-shi (JP)

(72) Inventors: Kenichi Watatani, Itami (JP); Miki Miyanaga, Itami (JP); Hideaki Awata, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 16/313,584

(22) PCT Filed: Feb. 28, 2017

(86) PCT No.: PCT/JP2017/007700
§ 371 (c)(1),
(2) Date: Dec. 27, 2018

(87) PCT Pub. No.: WO2018/020719
PCT Pub. Date: Feb. 1, 2018

(65) Prior Publication Data
US 2019/0292103 A1      Sep. 26, 2019

(30) Foreign Application Priority Data

Jul. 25, 2016   (JP) .................... 2016-145633

(51) Int. Cl.
*C04B 35/01* (2006.01)
*C04B 35/64* (2006.01)
(Continued)

(52) U.S. Cl.
CPC ............. *C04B 35/01* (2013.01); *C04B 35/64* (2013.01); *C04B 41/009* (2013.01);
(Continued)

(58) Field of Classification Search
CPC ....... C04B 35/01; C04B 41/80; C04B 41/009; C04B 41/0072; C04B 35/64;
(Continued)

(56) References Cited

U.S. PATENT DOCUMENTS

| | | |
|---|---|---|
| 2009/0308635 A1 | 12/2009 | Yano et al. |
| 2016/0251264 A1 | 9/2016 | Miyanaga et al. |
| 2020/0062651 A1* | 2/2020 | Miyanaga ............... C04B 35/01 |

FOREIGN PATENT DOCUMENTS

| | | |
|---|---|---|
| JP | H09-071860 A | 3/1997 |
| JP | 2008-192721 A | 8/2008 |

(Continued)

OTHER PUBLICATIONS

Utseno, JP 2010024087, Feb. 4, 2010, English Machine Translation.*

(Continued)

*Primary Examiner* — Caleen O Sullivan
(74) *Attorney, Agent, or Firm* — Baker Botts L.L.P.; Michael A. Sartori

(57) ABSTRACT

There are provided an oxide sintered material containing an $In_2O_3$ crystal phase, a $Zn_4In_2O_7$ crystal phase and a $ZnWO_4$ crystal phase, and a method of producing the oxide sintered material. The method includes forming the oxide sintered material by sintering a molded body containing In, W and Zn, and forming the oxide sintered material including placing the molded body at a first constant temperature selected from a temperature range of 500° C. or more and 1000° C. or less for 30 minutes or longer.

14 Claims, 5 Drawing Sheets

(51) Int. Cl.
    *C04B 41/00*     (2006.01)
    *C04B 41/80*     (2006.01)
    *H01L 21/02*     (2006.01)
    *H01L 29/66*     (2006.01)
    *C23C 14/34*     (2006.01)
    *C23C 14/08*     (2006.01)
    *H01J 37/34*     (2006.01)
    *H01L 29/786*     (2006.01)

(52) U.S. Cl.
    CPC .......... *C04B 41/0072* (2013.01); *C04B 41/80* (2013.01); *C23C 14/086* (2013.01); *C23C 14/34* (2013.01); *C23C 14/3407* (2013.01); *H01J 37/3426* (2013.01); *H01L 21/02631* (2013.01); *H01L 29/66969* (2013.01); *H01L 29/786* (2013.01); *H01L 29/7869* (2013.01); *C04B 2235/40* (2013.01); *C04B 2235/6567* (2013.01); *C04B 2235/6583* (2013.01); *H01L 21/02565* (2013.01)

(58) Field of Classification Search
    CPC .... C04B 2235/6583; C04B 2235/6567; C04B 2235/40; C04B 35/453; C04B 2235/80; C04B 2235/3258; C04B 2235/3284; C04B 35/62675; C04B 2235/604; C04B 2235/661; C04B 2235/761; C04B 2235/5436; C04B 2235/5445; C04B 2235/72; C04B 2235/3244; C04B 2235/3286; C04B 2235/326; C04B 2235/76; H01L 29/786; H01L 29/7869; H01L 29/66969; H01L 21/02631; H01L 21/02565; H01L 21/02554; C23C 14/34; C23C 14/3407; C23C 14/086; C23C 14/3414; H01J 37/3426; C03C 2218/33; C03C 17/3671; C03C 17/3655; C03C 17/3649; C03C 17/3615; C03C 17/36
    USPC ........................................................ 438/104
    See application file for complete search history.

(56) References Cited

FOREIGN PATENT DOCUMENTS

| | | |
|---|---|---|
| JP | 2008-199005 A | 8/2008 |
| JP | 2010-024087 A | 2/2010 |
| WO | 2016/024442 A1 | 2/2016 |

OTHER PUBLICATIONS

Office Action issued in U.S. Appl. No. 16/347,152 dated Apr. 1, 2020.
Office Action issued in U.S. Appl. No. 16/347,152 dated Jul. 21, 2020.

\* cited by examiner

OXIDE SINTERED MATERIAL AND METHOD OF MANUFACTURING THE SAME, SPUTTERING TARGET, AND METHOD OF MANUFACTURING SEMICONDUCTOR DEVICE

TECHNICAL FIELD

The present invention relates to an oxide sintered material and a method of producing the same, a sputtering target, and a method of manufacturing a semiconductor device.

The present application claims the benefit of priority to Japanese Patent Application No. 2016-145633 filed on Jul. 25, 2016, the content of which are incorporated herein by reference in its entirety.

BACKGROUND ART

Conventionally, an amorphous silicon (a-Si) film has been used mainly as a semiconductor film which functions as a channel layer of a semiconductor device such as a TFT (thin film transistor) in a liquid crystal display device, a thin film EL (electroluminescence) display device, an organic EL display device or the like.

In recent years, as a material to replace a-Si, attention has been focused on a complex oxide containing indium (In), gallium (Ga) and zinc (Zn), in other words, an In—Ga—Zn-based complex oxide (also referred to as "IGZO"). It is expected that such IGZO-based oxide semiconductor will have a higher carrier mobility than that in a-Si.

For example, Japanese Patent Laying-Open No. 2008-199005 (PTL 1) discloses that an oxide semiconductor film mainly composed of IGZO is formed by a sputtering method using an oxide sintered material as a target.

Japanese Patent Laying-open No. 2008-192721 (PTL 2) discloses an oxide sintered material containing In and tungsten (W) as a material suitably used for forming an oxide semiconductor film by a sputtering method or the like.

Moreover, Japanese Patent Laying-open No. 09-071860 (PTL 3) discloses an oxide sintered material containing In and Zn.

CITATION LIST

Patent Literature

PTL 1: Japanese Patent Laying-open No. 2008-199005
PTL 2: Japanese Patent Laying-open No. 2008-192721
PTL 3: Japanese Patent Laying-open No. 09-071860

SUMMARY OF INVENTION

According to one embodiment of the present invention, an oxide sintered material includes an $In_2O_3$ crystal phase, a $Zn_4In_2O_7$ crystal phase and a $ZnWO_4$ crystal phase.

According to another embodiment of the present invention, a sputtering target includes the oxide sintered material according to the aforementioned embodiment.

According to still another embodiment of the present invention, a method of manufacturing a semiconductor device including an oxide semiconductor film includes preparing a sputtering target according to the aforementioned embodiment, and forming the oxide semiconductor film by a sputtering method using the sputtering target.

According to still another embodiment of the present invention, a method of producing an oxide sintered material according to the aforementioned embodiment includes forming the oxide sintered material by sintering a molded body containing indium, tungsten and zinc. Forming the oxide sintered material includes placing the molded body at a first constant temperature selected from a temperature range of 500° C. or more and 1000° C. or less for 30 minutes or longer.

According to still another embodiment of the present invention, a method of producing an oxide sintered material according to the aforementioned embodiment includes preparing a primary mixture of a zinc oxide powder and an indium oxide powder, forming a calcined powder by heat-treating the primary mixture, preparing a secondary mixture of raw powders including the calcined powder; forming a molded body by molding the secondary mixture, and forming the oxide sintered material by sintering the molded body. Forming the calcined powder includes forming a complex oxide powder including zinc and tungsten as the calcined powder by heat-treating the primary mixture at a temperature of 550° C. or more and less than 1300° C. in an oxygen-containing atmosphere.

DETAILED DESCRIPTION

Figure 1A:
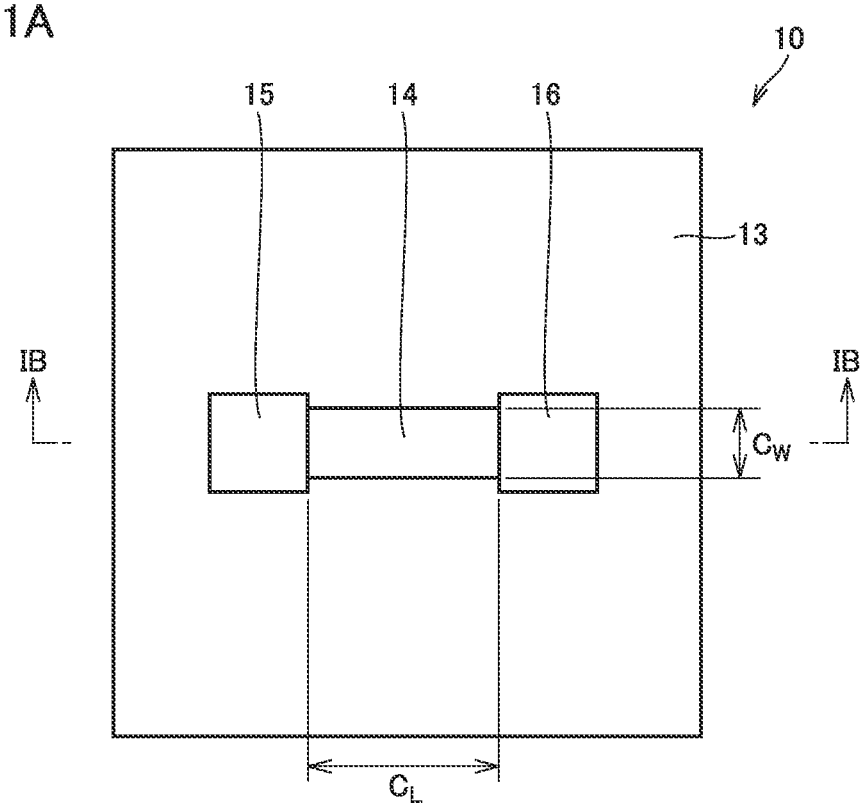
FIG. 1A is a schematic plan view illustrating an exemplary semiconductor device according to an embodiment of the present invention.

Problem to be Solved by Present Disclosure

As described in PTL 1, the TFT including the IGZO-based oxide semiconductor film as a channel layer has a problem that the field-effect mobility thereof is as low as about 10 $cm^2/Vs$.

Although PTL 2 proposes a TFT which includes, as a channel layer, an oxide semiconductor film formed by using an oxide sintered material containing In and W, no investigation has been made on the reliability of the TFT.

As described in PTL 3, the thin film formed by using the oxide sintered material is a transparent conductive film which has a lower electrical resistance than the semiconductor thin film used as a channel layer of a TFT, for example.

In a sputtering method using an oxide sintered material as a sputtering target, it is desired to reduce abnormal discharge during sputtering, and it is also desired to use an oxide sintered material which has a reduced amount of pores (vacancy) as a sputtering target. Regarding the oxide sintered material described in PTL 3, unless the oxide sintered material is prepared at a higher sintering temperature, it is impossible to reduce the amount of pores. However, if the sintering temperature is set to a higher temperature, the time required to raise the temperature and the time required to lower the temperature will become longer, and more electric energy will be needed to maintain the sintering atmosphere at a higher temperature, which thereby deteriorates the productivity. Moreover, if the sintering temperature is set to a higher temperature, tungsten oxide included in the raw material may be evaporated, and thereby, the obtained oxide sintered material may contain no W.

Further, according to the invention described in PTL 2, it is impossible to obtain an oxide sintered material having a high sintered density (the apparent density of the oxide sintered material after sintering), and as a result, the number of pores in the oxide sintered material is significantly large.

An object of the present invention is to provide an oxide sintered material containing In, W and Zn, which is capable of reducing abnormal discharge during sputtering and reducing the amount of pores in the oxide sintered material. Another object is to provide a method of producing the oxide sintered material capable of producing the oxide sintered material even at a lower sintering temperature.

Still another object is to provide a sputtering target including the oxide sintered material and a method of manufacturing a semiconductor device including an oxide semiconductor film formed by using the sputtering target.

Advantageous Effect of the Present Disclosure

According to the description in the above, it is possible to provide an oxide sintered material capable of reducing abnormal discharge during sputtering and the amount of pores contained therein. Further, according to the description in the above, it is possible to provide a method capable of producing the oxide sintered material even at a lower sintering temperature.

Description of Embodiments

First, embodiments of the present invention will be enumerated and described hereinafter.

[1] An oxide sintered material according to an embodiment of the present invention includes an $In_2O_3$ crystal phase, a $Zn_4In_2O_7$ crystal phase, and a $ZnWO_4$ crystal phase. According to the oxide sintered material, it is possible to reduce abnormal discharge during sputtering and reduce the amount of pores in the oxide sintered material. The oxide sintered material according to the present embodiment may be suitably used as a sputtering target for forming an oxide semiconductor film (such as an oxide semiconductor film serving as a channel layer) included in a semiconductor device.

[2] In the oxide sintered material according to the present embodiment, a diffraction angle 2θ at the X-ray diffraction peak derived from the $In_2O_3$ crystal phase is preferably greater than 50.70° and smaller than 51.04°, which is advantageous in reducing abnormal discharge during sputtering.

[3] In the oxide sintered material according to the present embodiment, the content of the $In_2O_3$ crystal phase is preferably 25 mass % or more and less than 98 mass % and the content of the $Zn_4In_2O_7$ crystal phase is preferably 1 mass % or more and less than 50 mass %, which is advantageous in reducing abnormal discharge during sputtering and the amount of pores in the oxide sintered material.

[4] In the oxide sintered material according to the present embodiment, the lattice constant of a C-plane of the $Zn_4In_2O_7$ crystal phase is preferably 33.53 Å or more and 34.00 Å or less, which is advantageous in reducing abnormal discharge during sputtering.

[5] In the oxide sintered material according to the present embodiment, the content of the $ZnWO_4$ crystal phase is preferably 0.1 mass % or more and less than 10 mass %, which is advantageous in reducing abnormal discharge during sputtering and the amount of pores in the oxide sintered material.

[6] In the oxide sintered material according to the present embodiment, the content of tungsten relative to the total of indium, tungsten and zinc in the oxide sintered material is preferably more than 0.1 atom % and less than 20 atom %, and the content of zinc relative to the total of indium, tungsten and zinc in the oxide sintered material is preferably more than 1.2 atom % and less than 40 atom %, which is advantageous in reducing abnormal discharge during sputtering and the amount of pores in the oxide sintered material.

[7] In the oxide sintered material according to the present embodiment, the content of zinc relative to the content of tungsten in the oxide sintered material is preferably greater than 1 and less than 80 by atom ratio, which is advantageous in reducing the amount of pores in the oxide sintered material.

[8] The oxide sintered material according to the present embodiment may further include zirconium (Zr). In this case, the content of zirconium relative to the total of indium, tungsten, zinc and zirconium in the oxide sintered material is preferably 0.1 ppm or more and 200 ppm or less by atom ratio, which is advantageous in maintaining a high field-effect mobility for a semiconductor device manufactured by using the oxide sintered material of the present embodiment as a sputtering target even if it is annealed at a high temperature.

[9] The sputtering target according to another embodiment of the present invention includes the oxide sintered material of the above embodiment. According to the present embodiment, since the sputtering target includes the oxide sintered material of the above embodiment, it is possible to reduce abnormal discharge during sputtering. In addition, according to the sputtering target of the present embodiment, since the amount of pores is reduced, it is possible to provide a semiconductor device having excellent characteristics such as capable of maintaining a high field-effect mobility even if it is annealed at a high temperature.

[10] A method of manufacturing a semiconductor device according to still another embodiment of the present invention is a method of manufacturing a semiconductor device including an oxide semiconductor film, the method includes preparing a sputtering target according to the above embodiment, and forming the oxide semiconductor film by a sputtering method using the sputtering target. According to the manufacturing method of the present embodiment, since the oxide semiconductor film is formed by the sputtering method using the sputtering target of the above embodiment, it is possible for the semiconductor device to exhibit excellent characteristics such as capable of maintaining a high field-effect mobility even if it is annealed at a high temperature. The semiconductor device is not particularly limited, and as a preferable example, a TFT (thin film transistor) which includes, as a channel layer, an oxide semiconductor film formed by a sputtering method using the sputtering target of the above embodiment may be given.

[11] A method of manufacturing an oxide sintered material according to still another embodiment of the present invention is the method of manufacturing the oxide sintered material of the above embodiment, the method includes forming the oxide sintered material by sintering a molded body containing indium, tungsten and zinc. Forming the oxide sintered material includes placing the molded body at a first constant temperature selected from a temperature range of 500° C. or more and 1000° C. or less for 30 minutes or longer, which is advantageous in producing the oxide sintered material of the above embodiment efficiently.

[12] In the method of producing an oxide sintered material according to the above embodiment in the above [11], forming the oxide sintered material includes placing the molded body at the first temperature for 30 minutes or longer, and placing the molded body in an oxygen-containing atmosphere at a second temperature which is 800° C. or more and less than 1200° C. and higher than the first temperature in this order, which is advantageous in reducing the amount of pores in the oxide sintered material to be obtained.

[13] A method of manufacturing an oxide sintered material according to still another embodiment of the present invention is a method of manufacturing an oxide sintered material of the above embodiment, the method includes preparing a primary mixture of a zinc oxide powder and an indium oxide powder, forming a calcined powder by heat-treating the primary mixture, preparing a secondary mixture of raw powders including the calcined powder, forming a molded body by molding the secondary mixture, and forming the oxide sintered material by sintering the molded body, forming the calcined powder including forming a complex oxide powder including zinc and tungsten as the calcined powder by heat-treating the primary mixture at a temperature of 550° C. or more and less than 1300° C. in an oxygen-containing atmosphere, which is advantageous in producing the oxide sintered material of the above embodiment efficiently.

[14] In the method of producing an oxide sintered material according to the above embodiment in the above [13], forming the oxide sintered material includes placing the molded body at a first constant temperature selected from a temperature range of 500° C. or more and 1000° C. or less for 30 minutes or longer, which is advantageous in producing the oxide sintered material of the above embodiment efficiently.

[15] In the method of producing an oxide sintered material according to the above embodiment in the above [14], forming the oxide sintered material includes placing the molded body at the first temperature for 30 minutes or longer, and placing the molded body in an oxygen-containing atmosphere at a second temperature which is selected from a temperature range of 800° C. or more and less than 1200° C. and higher than the first temperature in this order, which is advantageous in reducing the amount of pores in the oxide sintered material to be obtained.

Details of Embodiments

Embodiment 1: Oxide Sintered Material

The oxide sintered material according to the present embodiment contains In, W and Zn as metal elements, and includes an $In_2O_3$ crystal phase, a $Zn_4In_2O_7$ crystal phase and a $ZnWO_4$ crystal phase. According to the oxide sintered material, it is possible to reduce abnormal discharge during sputtering and the amount of pores in the oxide sintered material.

In the present specification, the term of "$In_2O_3$ crystal phase" refers to a crystal of an indium oxide mainly containing In and oxygen (O). More specifically, the $In_2O_3$ crystal phase is a bixbyite type crystal phase having a crystal structure defined in JCPDS (Joint Committee for Powder Diffraction Standards) card 6-0416, and is also called as rare earth oxide C-type phase (or C-rare earth structure phase). As long as the $In_2O_3$ crystal phase exhibits the above crystal system, the lattice constant thereof may vary due to the deficiency of oxygen, or the solid-dissolution of or the deficiency of element In and/or element W and/or element Zn or the solid-dissolution of other metal elements.

In the present specification, the term of "$ZnWO_4$ crystal phase" refers to a crystal of a complex oxide mainly containing Zn, W and O. More specifically, the $ZnWO_4$ crystal phase is a zinc tungstate compound crystal phase having a crystal structure represented by a space group of P12/c1(13) and having a crystal structure defined in JCPDS card 01-088-0251. As long as the $ZnWO_4$ crystal phase exhibits the above crystal system, the lattice constant thereof may vary due to the deficiency of oxygen, or the solid-dissolution of or the deficiency of element In and/or element W and/or element Zn or the solid-dissolution of other metal elements.

In the present specification, the "$Zn_4In_2O_7$ crystal phase" refers to a crystal of a complex oxide mainly containing Zn, In and O. More specifically, the $Zn_4In_2O_7$ crystal phase is a crystal phase having a laminated structure called a homologous structure, and has a crystal structure represented by a space group P63/mmc (194) and a crystal structure defined by JCPDS card 00-020-1438. As long as the $Zn_4In_2O_7$ crystal phase exhibits the above crystal system, the lattice constant thereof may vary due to the deficiency of oxygen, or the solid-dissolution of or the deficiency of element In and/or element W and/or element Zn or the solid-dissolution of other metal elements.

Each of the crystal phases mentioned above may be identified by X-ray diffraction. In other words, the presence of all of the $In_2O_3$ crystal phase, the $Zn_4In_2O_7$ crystal phase and the $ZnWO_4$ crystal in the oxide sintered material according to the present embodiment may be confirmed by the X-ray diffraction. Moreover, the X-ray diffraction may be used to measure the lattice constant of the $Zn_4In_2O_7$ crystal phase and the plane spacing of the $In_2O_3$ crystal phase.

The X-ray diffraction may be measured under the following conditions or equivalent conditions.

(Measurement Conditions for X-Ray Diffraction)
θ-2θ method,
X-ray source: Cu Kα ray,
X-ray tube voltage: 45 kV,
X-ray tube current: 40 mA,
Step width: 0.02°,
Step time: 1 second/step, Measurement range 2θ: 10° to 80°.

According to the oxide sintered material according to the present embodiment containing the $In_2O_3$ crystal phase and the $Zn_4In_2O_7$ crystal phase, it is possible to reduce abnormal discharge during sputtering. The possible reason may be that the electric resistance of the $Zn_4In_2O_7$ crystal phase is smaller than that of the $In_2O_3$ crystal phase. In order to reduce abnormal discharge during sputtering, the total content of the $In_2O_3$ crystal phase and the $Zn_4In_2O_7$ crystal phase in the oxide sintered material is preferably 80 mass % or more, and more preferably 85 mass % or more.

According to the oxide sintered material according to the present embodiment containing the $In_2O_3$ crystal phase and the $Zn_4In_2O_7$ crystal phase, it is possible to reduce the amount of pores in the oxide sintered material. The possible reason may be that the $ZnWO_4$ crystal phase plays the role of promoting sintering during the sintering step.

In the oxide sintered material, the diffraction angle 2θ at the X-ray diffraction peak derived from the $In_2O_3$ crystal phase is preferably greater than 50.70° and smaller than 51.04°, which is advantageous in reducing abnormal discharge during sputtering. The diffraction peak is attributed to the (440) plane of the $In_2O_3$ crystal phase.

If an element is solid-dissolved in or an element is deficient in at least a part of the $In_2O_3$ crystal phase, the plane spacing may become wider or narrower than the plane spacing defined in JCPDS card 6-0416. In the JCPDS card 6-0416, the diffraction peak attributed to the (440) plane of the $In_2O_3$ crystal phase is at a position where the diffraction angle 2θ is 51.04°, and the plane spacing of the (440) plane is 1.788 Å.

In other words, the X-ray diffraction peak attributed to the (440) plane of the oxide sintered material according to the present embodiment is preferably located at the lower angle side than the X-ray diffraction peak attributed to the (440) plane of the $In_2O_3$ crystal phase defined by the JCPDS card 6-0416, and has a smaller diffraction angle 2θ and a larger plane spacing.

As an example of elements that may be solid-dissolved in at least a part of the $In_2O_3$ crystal phase, at least one element selected from Zn, W, O, and Zr may be given.

As an example of elements that may cause element deficiency, at least one element selected from In and O may be given. The solid solution of elements or the deficiency of elements in the $In_2O_3$ crystal is advantageous in reducing the amount of pores in the oxide sintered material. In other words, the solid solution of elements or the deficiency of elements may promote the diffusion of elements during the sintering step.

Thereby, the elements may move together with each other during the sintering step, which makes it possible to reduce the pores in the oxide sintered material. Further, the solid solution of elements or the deficiency of elements in the $In_2O_3$ crystal phase constituting the oxide sintered material is effective in decreasing the electric resistance of the $In_2O_3$ crystal phase, and thereby is advantageous in reducing abnormal discharge during sputtering.

In order to reduce the amount of pores in the oxide sintered material and abnormal discharge during sputtering, the diffraction angle 2θ at the X-ray diffraction peak derived from the $In_2O_3$ crystal phase is preferably greater than 50.80°, and more preferably greater than 50.90°.

In the oxide sintered material, the content of the $In_2O_3$ crystal phase is preferably 25 mass % or more and less than 98 mass %, and the content of the $Zn_4In_2O_7$ crystal phase is preferably 1 mass % or more and less than 50 mass %, which is advantageous in reducing abnormal discharge during sputtering and the amount of pores in the oxide sintered material. The content of the $In_2O_3$ crystal phase refers to a ratio (mass %) of the $In_2O_3$ crystal phase when the total amount of the crystal phases detected by X-ray diffraction measurement described below is set to 100 mass %. The same applies to the other crystal phases.

When the content of the $In_2O_3$ crystal phase is 25 mass % or more, it is advantageous in reducing abnormal discharge during sputtering, and when the content of the $In_2O_3$ crystal phase is less than 98 mass %, it is advantageous in reducing the amount of pores in the oxide sintered material.

In order to reduce abnormal discharge during sputtering and the amount of pores in the oxide sintered material, the content of the $In_2O_3$ crystal phase is more preferably 70 mass % or more and 95 mass % or less, and further preferably 75 mass % or more and 90 mass % or less.

When the content of the $Zn_4In_2O_7$ crystal phase is 1 mass % or more, it is advantageous in reducing abnormal discharge during sputtering, and when the content of the $Zn_4In_2O_7$ crystal phase is less than 50 mass %, it is advantageous in reducing the amount of pores in the oxide sintered material.

In order to reduce abnormal discharge during sputtering and the amount of pores in the oxide sintered material, the content of the $Zn_4In_2O_7$ crystal phase is more preferably 5 mass % or more and 30 mass % or less, and further preferably 9 mass % or more and 20 mass % or less.

The $Zn_4In_2O_7$ crystal phase grows into a spindle shape in the sintering step, and thereby, it is present in the oxide sintered material as spindle-shaped particles. The aggregate of spindle-shaped particles tends to generate more pores in the oxide sintered material than the aggregate of circular particles. Therefore, the content of $Zn_4In_2O_7$ crystal phase is preferably less than 50 mass %. On the other hand, if the content of the $Zn_4In_2O_7$ crystal phase is too small, the electrical resistance of the oxide sintered material increases, causing the arcing frequency to increase during sputtering. Thus, the content of the $Zn_4In_2O_7$ crystal phase is preferably 1 mass % or more.

The content of each crystal phase in the oxide sintered material may be calculated by a RIR method (Reference Intensity Ratio) using X-ray diffraction. Generally, the RIR method quantifies the content based on the integral intensity ratio of the strongest line of each crystal phase and the RIR value described in the ICDD card, but in the case of a complex oxide such as the oxide sintered material according to the present embodiment which is difficult to separate the peak of the strongest line, firstly, the X-ray diffraction peaks clearly separated for each compound are selected, and then the content of each crystal phase is calculated from the integrated intensity ratio and the RIR value (or by an equivalent method). The measurement conditions of X-ray diffraction performed in determining the content of each crystal phase are the same as or equivalent to the above-mentioned measurement conditions.

In the oxide sintered material, the lattice constant of the C-plane of the $Zn_4In_2O_7$ crystal phase is preferably 33.53 Å or more and 34.00 Å or less, which is advantageous in reducing abnormal discharge during sputtering. In order to reduce abnormal discharge during sputtering, the lattice constant of the C-plane of the $Zn_4In_2O_7$ crystal phase is more preferably 33.53 Å or more and 34 Å or less, and further preferably 33.54 Å or more and 33.59 Å or less.

The lattice constant of the C-plane of the $Zn_4In_2O_7$ crystal phase is calculated by using X-ray diffraction. Measurement conditions of X-ray diffraction are the same as or equivalent to the above-mentioned measurement conditions. When measured under the above-mentioned conditions, the diffraction peak from the C-plane of the $Zn_4In_2O_7$ crystal phase may appear in the range of 2θ=31.5° or more and less than 32.8°. The lattice constant of the C-plane of the $Zn_4In_2O_7$ crystal phase is 33.52 Å when it has a crystal structure defined by the JCPDS card 00-020-1438, but the lattice constant of the C-plane of the $Zn_4In_2O_7$ crystal phase contained in the oxide sintered material according to the present embodiment is greater than 33.52 Å, and is preferably 33.53 Å or more and 34.00 Å or less. The $Zn_4In_2O_7$ crystal phase having such a lattice constant is advantageous in reducing abnormal discharge during sputtering.

The lattice constant of 33.53 Å or more and 34.00 Å or less may be achieved, for example, by solid-dissolving element In and/or element W and/or element Zn and/or another metal elements in the $Zn_4In_2O_7$ crystal phase. Due to the solid solution of these elements, the electrical resistance of the $Zn_4In_2O_7$ crystal phase is lowered, and accordingly, the electrical resistance of the oxide sintered material is lowered, which makes it possible to reduce abnormal discharge during sputtering.

In the oxide sintered material, the content of the $ZnWO_4$ crystal phase is preferably 0.1 mass % or more and less than 10 mass %, which is advantageous in reducing abnormal discharge during sputtering and the amount of pores in the oxide sintered material. The content of $ZnWO_4$ crystal phase is more preferably 0.5 mass % or more and further preferably 0.9 mass % or more so as to reduce the amount of pores in the oxide sintered material, and is more preferably 5.0 mass % or less and further preferably 2.0 mass % or less so as to reduce abnormal discharge during sputtering.

The content of the $ZnWO_4$ crystal phase may be calculated by the above-mentioned MR method using X-ray diffraction. It is found that the $ZnWO_4$ crystal phase has a higher electrical resistivity than the $In_2O_3$ crystal phase and the $Zn_4In_2O_7$ crystal phase. Therefore, if the content of the $ZnWO_4$ crystal phase in the oxide sintered material is too high, abnormal discharge may occur in the $ZnWO_4$ crystal phase during sputtering. On the other hand, if the content of $ZnWO_4$ crystal phase is less than 0.1 mass %, the sintering in the sintering step will not be promoted, resulting a greater number of pores in the sintered material.

In the oxide sintered material, the content of W (hereinafter also referred to as "W content") relative to the total of In, W and Zn in the oxide sintered material is more than 0.1 atom % and less than 20 atom %, and the content of Zn (hereinafter also referred to as "Zn content") relative to the total of In, W and Zn in the oxide sintered material is preferably more than 1.2 atom % and less than 40 atom %, which is advantageous in reducing abnormal discharge during sputtering and the amount of pores in the oxide sintered material.

The W content is more preferably 0.3 atom % or more and further preferably 0.6 atom % or more so as to reduce the amount of pores in the oxide sintered material, and is more preferably 15 atom % or less, further preferably 5 atom % or less and further preferably 2 atom % or less so as to reduce abnormal discharge during sputtering.

Making the W content more than 0.1 atom % is advantageous in reducing the amount of pores in the oxide sintered material. As described above, it is considered that the $ZnWO_4$ crystal phase plays the role of an auxiliary agent for promoting sintering in the sintering step. Therefore, it is desirable that the $ZnWO_4$ crystal phase is generated with high dispersion during sintering so as to obtain an oxide sintered material with a small amount of pores. In the sintering step, if the element Zn and the element W are brought into contact with each other efficiently, the reaction will be promoted, which makes it possible to form the $ZnWO_4$ crystal phase. Therefore, if the W content in the sintered material is made more than 0.1 atom %, the element Zn and the element W may be brought into contact with each other efficiently. If the W content is 0.1 atom % or less, switching driving can not be confirmed in a semiconductor device including an oxide semiconductor film formed by a sputtering method using the oxide sintered material as a sputtering target. The possible reason may be that the electric resistance of the oxide semiconductor film is too low. If the W content is 20 atom % or more, the content of the $ZnWO_4$ crystal phase in the oxide sintered material becomes relatively too large, it is impossible to suppress abnormal discharge starting from the $ZnWO_4$ crystal phase, which makes it difficult to reduce abnormal discharge during sputtering.

In order to reduce the amount of pores in the oxide sintered material, the Zn content is more preferably 2.0 atom % or more and less than 30 atom %, further preferably more than 5.0 atom % and less than 20 atom %, and even more preferably more than 10.0 atom % and less than 18 atom %.

The Zn content is preferably more than 1.2 atom % and less than 40 atom % so as to reduce the amount of pores in the oxide sintered material. If the Zn content is 1.2 atom % or less, it would be difficult to reduce the amount of pores in the oxide sintered material. If the Zn content is 40 atom % or more, the content of the $Zn_4In_2O_7$ crystal phase in the oxide sintered material becomes relatively too large, it would be difficult to reduce the amount of pores in the oxide sintered material.

The Zn content has an effect of maintaining a high field-effect mobility for a semiconductor device including an oxide semiconductor film formed by a sputtering method using the oxide sintered material as a sputtering target even if it is annealed at a high temperature. Therefore, the Zn content is more preferably 2.0 atom % or more, further preferably more than 5.0 atom %, and even more preferably more than 10.0 atom %.

The contents of In, Zn and W in the oxide sintered material may be measured by ICP emission spectrometry. The Zn content means the amount of Zn/(the amount of In+the amount of Zn+the amount of W) expressed in terms of percentage, and the W content means the amount of W/(the amount of In+the amount of Zn+the amount of W) expressed in terms of percentage. Each amount is expressed by the number of atoms.

The Zn content relative to the W content in the oxide sintered material (hereinafter also referred to as "Zn/W ratio") is preferably greater than 1 and less than 80 by atom ratio, which is advantageous in reducing the amount of pores in the oxide sintered material or reducing abnormal discharge. In order to reduce the amount of pores, the Zn/W ratio is more preferably greater than 10 and less than 60, and further preferably greater than 15 and less than 40.

As described above, it is considered that the $ZnWO_4$ crystal phase plays the role of an auxiliary agent for promoting sintering in the sintering step. Therefore, it is desirable that the $ZnWO_4$ crystal phase is generated with high dispersion during sintering so as to obtain an oxide sintered material with a small amount of pores. In the sintering step, if the element Zn and the element W are brought into contact with each other efficiently, the reaction will be promoted, which makes it possible to form the $ZnWO_4$ crystal phase.

In order to generate a highly dispersed $ZnWO_4$ crystal phase during the sintering step, it is desirable that the element Zn is present at a larger amount than the element W. Therefore, the Zn/W ratio is preferably greater than 1. If the Zn/W ratio is 1 or less, the $ZnWO_4$ crystal phase may not be generated with high dispersion during the sintering step, which makes it difficult to reduce the amount of pores. Furthermore, if the Zn/W ratio is 1 or less, Zn preferentially reacts with W during the sintering step to form the $ZnWO_4$ crystal phase, so that the amount of Zn for forming the $Zn_4In_2O_7$ crystal phase is deficient, and as a result, the $Zn_4In_2O_7$ crystal phase is less likely to be formed in the oxide sintered material, the electrical resistance of the oxide sintered material increases, causing the arcing frequency to increase during sputtering. However, if the Zn/W ratio is 80 or more, the content of the $Zn_4In_2O_7$ crystal phase in the oxide sintered material becomes relatively too large, it would be difficult to reduce the amount of pores in the oxide sintered material.

The oxide sintered material may further include zirconium (Zr). In this case, the content of Zr (hereinafter also referred to as "Zr content") relative to the total of In, W, Zn and Zr in the oxide sintered material is preferably 0.1 ppm or more and 200 ppm or less by atom ratio, which is advantageous in maintaining a high field-effect mobility for a semiconductor device manufactured by using the oxide sintered material as a sputtering target even if it is annealed at a high temperature.

In order to maintain a high field-effect mobility for a semiconductor device even if it is annealed at a high temperature, the Zr content is more preferably 0.5 ppm or more and less than 100 ppm, and further preferably 2 ppm or more and less than 50 ppm.

The Zr content in the oxide sintered material may be measured by ICP emission spectrometry. The Zr content means the amount of Zr/(the amount of In+the amount of Zn+the amount of W+the amount of Zr), which is expressed in terms of parts per million. Each amount is expressed by the number of atoms.

Embodiment 2: Method of Producing Oxide Sintered Material

In order to efficiently producing the oxide sintered material according to Embodiment 1, it is preferable for the method of producing the oxide sintered material to satisfy one or more of the following conditions (1) to (3), it is more preferable for it to satisfy 2 or more conditions, and it is further preferable for it to satisfy all of the 3 conditions.

condition (1): including a step of forming the oxide sintered material by sintering a molded body containing indium, tungsten and zinc, and the step of forming the oxide sintered material includes placing the molded body at a first constant temperature selected from a temperature range of 500° C. or more and 1000° C. or less for 30 minutes or longer;

condition (2): including a step of forming the oxide sintered material by sintering a molded body containing indium, tungsten and zinc, and the step of forming the oxide sintered material includes placing the molded body at the first temperature for 30 minutes or longer, and placing the molded body in an oxygen-containing atmosphere at a second temperature which is preferably 800° C. or more and less than 1200° C. and higher than the first temperature in this order;

condition (3): including a step of preparing a primary mixture of a zinc oxide powder and an indium oxide powder; a step of forming a calcined powder by heat-treating the primary mixture; preparing a secondary mixture of raw powders including the calcined powder; a step of forming a molded body by molding the secondary mixture; and a step of forming the oxide sintered material by sintering the molded body.

"Placing a molded body at a first constant temperature selected from a temperature range of 500° C. or more and 1000° C. or less" in the above conditions (1) and (2) may be, for example, a heating process in the step of forming the oxide sintered material through sintering (sintering step). As described above, in order to obtain an oxide sintered material with a small amount of pores, it is preferable to form a highly dispersed $ZnWO_4$ crystal phase during the sintering step, and thereby, the molded body is placed at the first temperature for 30 minutes or longer so as to form a highly dispersed $ZnWO_4$ crystal phase. Moreover, in order to obtain an oxide sintered material capable of reducing abnormal discharge during sputtering, it is preferable to form a $Zn_4In_2O_7$ crystal phase during the sintering step, and thereby, the molded body is placed at the first temperature for 30 minutes or longer so as to form a highly dispersed $Zn_4In_2O_7$ crystal phase. After the step of placing the molded body at the first temperature so as to produce a highly dispersed $ZnWO_4$ crystal phase, by increasing the heating temperature to the maximum temperature of the sintering step so as to promote the sintering, it is possible to obtain an oxide sintered material which contains the $In_2O_3$ crystal phase, the $Zn_4In_2O_7$ crystal phase and the $ZnWO_4$ crystal phase and has a small amount of pores. In addition, by placing the molded body at the first temperature, the amount of W and Zn solid-dissolved in $In_2O_3$ will be adjusted, which makes it possible to modify the ratio of $Zn_4In_2O_7$ crystal phase and $ZnWO_4$ crystal phase to a desired ratio.

It should be noted that the term of "the first constant temperature" in the phrase of "the first constant temperature selected from a temperature range of 500° C. or more and 1000° C. or less" is not necessarily limited to a specific temperature, it may be a temperature range with a margin. Specifically, if a specific temperature selected from a temperature range of 500° C. or more and 1000° C. or less is denoted as T (° C.), the first temperature may be for example T±50° C., preferably T±20° C., more preferably T±10° C., and further preferably T±5° C. as long as it is within the temperature range of 500° C. or more and 1000° C. or less.

The molded body containing In, W and Zn in the above conditions (1) and (2) may be a molded body containing an indium oxide powder, a tungsten oxide powder and a zinc oxide powder which are raw powders of the oxide sintered material. In the method of producing the oxide sintered material according to the present embodiment, an $In_2O_3$ powder may be used as the indium oxide powder. As the tungsten oxide powder, an oxide powder containing at least one crystal phase selected from the group consisting of a $WO_3$ crystal phase, a $WO_2$ crystal phase and a $WO_{2.72}$ crystal phase may be used. As the zinc oxide powder, a ZnO powder may be used.

"Placing the molded body in an oxygen-containing atmosphere at a second temperature which is preferably 800° C. or more and less than 1200° C. and higher than the first temperature" in the above condition (2) is a step of promoting or completing the sintering. The oxygen-containing atmosphere may be air atmosphere, nitrogen-oxygen mixed atmosphere, oxygen atmosphere or the like. The second temperature is more preferably 900° C. or more and 1195° C. or less, and further preferably 1100° C. or more and 1190° C. or less. If the second temperature is 800° C. or more, it is advantageous in reducing the amount of pores in the oxide sintered material. If the second temperature is less than 1200° C., it is advantageous in suppressing the deformation of the oxide sintered material so as to fit it properly to the sputtering target.

In the method satisfying the above condition (3), a calcined powder composed of a complex oxide containing Zn and In is formed from a zinc oxide powder and an indium oxide powder, and the calcined powder is used to form a molded body containing indium oxide powder and tungsten oxide powder and zinc oxide powder, and the molded body is sintered to give the oxide sintered material.

The calcined powder preferably contains the $Zn_4In_2O_7$ crystal phase. In order to obtain the calcined powder containing the $Zn_4In_2O_7$ crystal phase, an indium oxide powder such as an $In_2O_3$ powder and a zinc oxide powder such as a ZnO powder are mixed so that the molar ratio of $In_2O_3$: ZnO=1:4 to prepare a primary mixture, and the primary mixture is heat-treated in an oxygen-containing atmosphere. The oxygen-containing atmosphere may be air atmosphere, nitrogen-oxygen mixed atmosphere, oxygen atmosphere or the like. The heat treatment temperature is preferably 550° C. or more and less than 1300° C., and more preferably 1200° C. or more.

According to the method including the step of forming a calcined powder containing the $Zn_4In_2O_7$ crystal phase, the step of preparing a secondary mixture by using the calcined powder, and the step of forming a molded body by molding the secondary mixture, in the step of forming the oxide sintered material by sintering the molded body (sintering step), if the element Zn and the element W are brought into contact with each other efficiently, the reaction will be promoted, which makes it possible to form the $ZnWO_4$ crystal phase. As described above, it is considered that the $ZnWO_4$ crystal phase plays the role of an auxiliary agent for promoting sintering. Therefore, if the $ZnWO_4$ crystal phase is generated with high dispersion during sintering, it is possible to obtain an oxide sintered material with a small amount of pores. In other words, if the sintering is performed simultaneously as the $ZnWO_4$ crystal phase is being formed, it is possible to obtain an oxide sintered material with a small amount of pores.

Further, according to the method including the step of forming a calcined powder containing the $Zn_4In_2O_7$ crystal phase, the step of preparing a secondary mixture by using the calcined powder, and the step of forming a molded body by molding the secondary mixture, the $Zn_4In_2O_7$ crystal phase tends to remain in the oxide sintered material even after the sintering step, which makes it possible to obtain an oxide sintered material in which the $Zn_4In_2O_7$ crystal phase is highly dispersed. The $Zn_4In_2O_7$ crystal phase highly dispersed in the oxide sintered material can reduce abnormal discharge during sputtering.

In the step of preparing the secondary mixture after forming the calcined powder containing the $Zn_4In_2O_7$ crystal phase, the calcined powder may be mixed with the indium oxide powder (for example, $In_2O_3$ powder) and the tungsten oxide powder (for example, an oxide power such as $WO_3$ powder containing at least one crystal phase selected from a group consisting of $WO_3$ crystal phase, $WO_2$ crystal phase and $WO_{2.72}$ crystal phase). In preparing the secondary mixture, it is desirable that the mixing ratio of the raw powders is adjusted so that the W content, Zn content, Zn/W ratio in the finally obtained oxide sintered material fall within the above-mentioned preferable ranges, respectively.

For example, it would be difficult to obtain a suitable oxide sintered material if the oxide sintered material is produced according to any of the following methods (i) to (iii):

(i) a method of forming three kinds of powders of the indium oxide powder, the tungsten oxide powder and the zinc oxide powder, molding and sintering the mixture powder without going through the step of forming the calcined powder. In this case, since the element Zn and the element W are not brought into contact with each other efficiently, the reaction will not be promoted, which makes it difficult to obtain an oxide sintered material with a small amount of pores or an oxide sintered material containing an $In_2O_3$ crystal phase, a $Zn_4In_2O_7$ crystal phase and a $ZnWO_4$ crystal phase. In addition, since it is difficult to obtain an oxide sintered material containing a $Zn_4In_2O_7$ crystal phase, it would be difficult to suppress the occurrence of arcing during sputtering.

(ii) a method of forming a powder containing the $ZnWO_4$ crystal phase as the calcined powder, mixing the calcined powder with indium oxide powder and zinc oxide powder, forming a molded body, and sintering the molded body. In this case, the $ZnWO_4$ crystal phase can not be highly dispersed, which makes it difficult to obtain an oxide sintered material with a small amount of pores.

(iii) a method of forming a powder containing the $InW_6O_{12}$ crystal phase as the calcined powder, mixing the calcined powder with indium oxide powder and zinc oxide powder, forming a molded body, and sintering the molded body. Also in this case, it would be difficult to obtain an oxide sintered material with a small amount of pores.

Therefore, in a method of molding and sintering the powder prepared by the method of mixing three kinds of powders of the indium oxide powder, the tungsten oxide powder and the zinc oxide powder, the method of forming a powder containing the $ZnWO_4$ crystal phase as the calcined powder, and the method of forming a powder containing the $InW_6O_{12}$ crystal phase as the calcined powder so as to obtain the oxide sintered material according to Embodiment 1, it is preferable to adopt the condition (1) or (2) described in the above.

Hereinafter, the method of producing the oxide sintered material according to the present embodiment will be described more specifically. In one preferred embodiment, the method of producing an oxide sintered material is a method of producing an oxide sintered material according to Embodiment 1 including a step of preparing a primary mixture of a zinc oxide powder and an indium oxide powder; a step of forming a calcined powder by heat-treating the primary mixture; a step of preparing a secondary mixture of raw powders including the calcined powder; a step of forming a molded body by molding the secondary mixture; and a step of forming the oxide sintered material by sintering the molded body, wherein the step of forming the calcined powder includes forming a complex oxide powder including zinc and tungsten as the calcined powder by heat-treating the primary mixture at a temperature of 550° C. or more and less than 1300° C. in an oxygen-containing atmosphere.

According to the manufacturing method mentioned above, it is possible to efficiently produce the oxide sintered material according to Embodiment 1 which may reduce abnormal discharge during sputtering, has a reduced amount of pores, and may be suitably used as a sputtering target. According to the manufacturing method mentioned above, even at a relatively low sintering temperature, it is possible to produce an oxide sintered material with a reduced amount of pores and capable of reducing abnormal discharge during sputtering. The complex oxide constituting the calcined powder may be deficient in oxygen or may be subjected to metal substitution.

If the heating temperature in the step of forming the calcined powder is less than 550° C., the complex oxide powder containing Zn and In may not be obtained, and if the heating temperature is 1300° C. or more, the particle size of the complex oxide powder may become too large to be used suitably. The heating temperature is more preferably 1200° C. or more.

Further, if a semiconductor device is manufactured by including, as a channel layer, an oxide semiconductor film which is formed by using a sputtering target including the oxide sintered material obtained by heat-treating the complex oxide powder containing Zn and In as the calcined powder, it is possible for it to maintain a high field-effect mobility even if it is annealed at a high temperature.

It is preferable that the complex oxide containing Zn and In further contains a $Zn_4In_2O_7$ crystal phase. Thereby, it is possible to obtain an oxide sintered material capable of reducing abnormal discharge during sputtering and having a reduced amount of pores. The $Zn_4In_2O_7$ crystal phase is a complex oxide crystal phase of Zn and In having a crystal structure represented by a space group P63/mmc (194) and having a crystal structure defined by JCPDS card 00-020-1438. As long as the $Zn_4In_2O_7$ crystal phase exhibits the above crystal system, the lattice constant thereof may vary due to the deficiency of oxygen and/or the solid-dissolution of other metal elements. The $Zn_4In_2O_7$ crystal phase may be identified by X-ray diffraction.

In order to obtain an oxide sintered material capable of reducing abnormal discharge during sputtering and having a reduced amount of pores, it is effective that a complex oxide containing Zn having a low melting point and W is present in the oxide sintered material containing In, W and Zn at the time of sintering. To this end, it is preferable to increase the number of contact points between the tungsten element and the zinc element at the time of sintering so as to form a complex oxide containing Zn and W in the molded body in a highly dispersed state. Further, since the complex oxide containing Zn and W is formed during the sintering step, it is possible obtain the oxide sintered material capable of reducing abnormal discharge during sputtering and having a reduced amount of pores at a low sintering temperature. Therefore, it is preferable to use a preliminarily synthesized complex oxide powder containing Zn and In in the manufacturing process so as to increase the number of contact points with W, so that an oxide sintered material capable of reducing abnormal discharge during sputtering and having a reduced amount of pores may be obtained at a low sintering temperature.

Further, according to the method including the step of forming a calcined powder containing the $Zn_4In_2O_7$ crystal phase, the step of preparing a secondary mixture by using the calcined powder, and the step of forming a molded body by molding the secondary mixture, the $Zn_4In_2O_7$ crystal phase tends to remain in the oxide sintered material even after the sintering step, which makes it possible to obtain an oxide sintered material containing a highly dispersed $Zn_4In_2O_7$ crystal phase. Alternatively, the highly dispersed $Zn_4In_2O_7$ crystal phase may be formed by placing the molded body at the first temperature for 30 minutes or longer. The $Zn_4In_2O_7$ crystal phase highly dispersed in the oxide sintered material helps to reduce abnormal discharge during sputtering, and thereby is desirable.

It is preferable that the tungsten oxide powder used for producing the oxide sintered material contains at least one crystal phase selected from the group consisting of a $WO_3$ crystal phase, a $WO_2$ crystal phase and a $WO_{2.72}$ crystal phase, which makes it possible to obtain an oxide sintered material capable of reducing abnormal discharge during sputtering and having a reduced amount of pores as well as a semiconductor device which includes an oxide semiconductor film formed by a sputtering method using the oxide sintered material as a sputtering target and capable of maintaining a high field-effect mobility even if it is annealed at a high temperature, and thereby is advantageous. From this viewpoint, the $WO_{2.72}$ crystal phase is more preferable.

The median particle size d50 of the tungsten oxide powder is preferably 0.1 µm or more and 4 µm or less, more preferably 0.2 µm or more and 2 µm or less, and further preferably 0.3 µm or more and 1.5 µm or less, which makes it possible to increase the apparent density and the mechanical strength of the oxide sintered material. The median particle size d50 may be determined by BET specific surface area measurement. If the median particle size d50 is smaller than 0.1 µm, it would be difficult to handle the powder, and it would be difficult to uniformly mix the complex oxide powder containing Zn and In with the tungsten oxide powder. If the median particle size d50 is greater than 4 µm, it would be difficult to reduce the amount of pores in the oxide sintered material to be obtained.

The method of manufacturing the oxide sintered material according to the present embodiment is not particularly limited, in order to efficiently form the oxide sintered material of Embodiment 1, it should include the following steps, for example:

(1) Step of Preparing Raw Powders

As the raw powders of the oxide sintered material, oxide powders of metal elements constituting the oxide sintered material such as the indium oxide powder (for example, $In_2O_3$ powder), the tungsten oxide powder (for example, $WO_3$ powder, $WO_{2.72}$ powder, $WO_2$ powder), and the zinc oxide powder (for example, ZnO powder) are prepared. If the oxide sintered material contains zirconium, then a zirconium oxide powder (for example, $ZrO_2$ powder) is prepared as the raw material.

As the tungsten oxide powder, a powder having a chemical composition in which oxygen is deficient as compared with $WO_3$ powder such as $WO_{2.72}$ powder and $WO_2$ powder may be used preferably, which makes it possible to obtain an oxide sintered material capable of reducing abnormal discharge during sputtering and having a reduced number and a semiconductor device which includes an oxide semiconductor film formed by a sputtering method using the oxide sintered material as a sputtering target and capable of maintaining a high field-effect mobility even if it is annealed at a high temperature. From this viewpoint, it is more preferable that at least a part of the tungsten oxide powder is the $WO_{2.72}$ powder. In order to prevent the inclusion of unintentional metal elements and Si into the oxide sintered material so as to obtain a semiconductor device which includes an oxide semiconductor film formed by a sputtering method using an oxide sintered material as a sputtering target and has stable physical properties, it is preferable that the purity of the raw powders is as high as 99.9 mass % or more.

As described above, it is preferable that the median particle size d50 of the tungsten oxide powder is 0.1 µm or more and 4 µm or less, which makes it possible to obtain an oxide sintered material having appropriate apparent density and mechanical strength as well as reduced amount of pores.

(2) a Step of Preparing a Primary Mixture of a Zinc Oxide Powder and an Indium Ooxide Powder Among the raw powders mentioned above, the zinc oxide powder and the indium oxide powder are mixed (or pulverized and mixed). In order to obtain a calcined powder containing a $Zn_4In_2O_7$ crystal phase, the $In_2O_3$ powder serving as the indium oxide powder and the ZnO powder serving as the zinc oxide powder are mixed so that the molar ratio of $In_2O_3$:ZnO=1:4. In order to obtain an oxide sintered material capable of reducing abnormal discharge during sputtering and having a reduced number and a semiconductor device which includes an oxide semiconductor film formed by a sputtering method using the oxide sintered material as a sputtering target and capable of maintaining a high field-effect mobility even if it is annealed at a high temperature, it is preferable that the calcined powder contains the $Zn_4In_2O_7$ crystal phase.

The method of mixing the zinc oxide powder and the indium oxide powder is not particularly limited, and it may be either a dry-type method or a wet-type method. Specifically, the zinc oxide powder and the indium oxide powder may be pulverized and mixed by using a ball mill, a planetary ball mill, a bead mill or the like. In this way, a primary mixture of the raw powders is obtained. When the mixture is obtained by the wet-type pulverizing and mixing method, a drying method such as air drying or spray drying may be used to dry the wet mixture.

(3) a Step of Forming a Calcined Powder From a Complex Oxide Containing Zn and In The obtained primary mixture is heat-treated (calcined) to form a calcined powder (a complex oxide powder containing Zn and In). In order to prevent the particle size of the calcined product from becoming too large so as to suppress the increase of the pores in the sintered material, the calcination temperature for the primary mixture is preferably less than 1300° C., and in order to obtain a complex oxide powder containing Zn and In as the calcined product and further containing a $Zn_4In_2O_7$ crystal phase, the calcination temperature is preferably 550° C. or more, and more preferably 1200° C. or more. As long as the calcination temperature is high enough to form the crystal phase, it is preferably as low as possible so as to make the particle size of the calcined powder as small as possible. In this way, a calcined powder containing a $Zn_4In_2O_7$ crystal phase may be obtained. The calcination atmosphere may be any atmosphere as long as it contains oxygen, and preferably may be an air atmosphere having an air pressure or a pressure higher than the air pressure, or an oxygen-nitrogen mixed atmosphere containing 25 vol % or more of oxygen having an air pressure or a pressure higher than the air pressure. From the viewpoint of improving productivity, the air atmosphere having an air pressure or a pressure around the air pressure is more preferred.

(4) a Step of Preparing a Secondary Mixture of the Raw Powders Including the Calcined Powder Next, the obtained calcined powder, the indium oxide powder (for example, $In_2O_3$ powder) and the tungsten oxide powder (for example, $WO_{2.72}$ powder) are mixed (or pulverized and mixed) in the same manner as the preparation of the primary mixture. In this way, a secondary mixture of the raw powders is obtained. The zinc oxide is preferably present as a complex oxide with indium by the calcination step. If zirconium is contained in the oxide sintered material, then the zirconium oxide powder (for example, $ZrO_2$ powder) is mixed (or pulverized and mixed) at the same time.

The mixing method in the step is not particularly limited, and it may be either a dry-type method or a wet-type method. Specifically, the calcined powder, the indium oxide powder and the tungsten oxide powder may be pulverized and mixed by using a ball mill, a planetary ball mill, a bead mill or the like. In this way, a primary mixture of the raw powders is obtained. When the mixture is obtained by the wet-type pulverizing and mixing method, a drying methods such as air drying and spray drying may be used to dry the wet mixture.

(5) a Step of Forming a Molded Body by Molding the Secondary Mixture

Next, the obtained secondary mixture is molded. The method of molding the secondary mixture is not particularly limited, but from the viewpoint of improving the apparent density of the oxide sintered material, a uniaxial pressing method, a CIP (Cold Isostatic Pressing) method, a casting method or the like is preferred.

(6) a Step of Forming an Oxide Sintered Material by Sintering the Molded Body (Sintering Step)

Next, the obtained molded body is sintered to form an oxide sintered material. At this time, if a hot press sintering method is used, it would be difficult to obtain an oxide sintered material capable of reducing abnormal discharge during sputtering and having a reduced amount of pores. In order to obtain an oxide sintered material capable of reducing abnormal discharge during sputtering and having a reduced amount of pores, the sintering temperature of the molded body (the second temperature) is preferably 800° C. or more and less than 1200° C., more preferably 900° C. or more and 1195° C. or less, and further preferably 1100° C. or more and 1190° C. or less. If the second temperature is 800° C. or more, it is advantageous in reducing the amount of pores in the oxide sintered material, and if the second temperature is less than 1200° C., it is advantageous in suppressing the deformation of the oxide sintered material so as to fit it properly to the sputtering target. In order to obtain an oxide sintered material capable of reducing abnormal discharge during sputtering and having a reduced amount of pores, it is preferable that the sintering atmosphere is an air atmosphere having an air pressure or a pressure around the air pressure.

As described above, in order to obtain an oxide sintered material capable of reducing abnormal discharge during sputtering and having a reduced number of bores, before placing the molded body at the second temperature of 800° C. or more and less than 1200° C., it is preferable to place the molded body at a first constant temperature (lower than the second temperature) selected from a temperature range of 500° C. or more and 1000° C. or less for 30 minutes or longer. This step may be a heating process in the sintering step.

Embodiment 3: Sputtering Target

The sputtering target according to the present embodiment includes the oxide sintered material of Embodiment 1. Therefore, according to the sputtering target of the present embodiment, it is possible to reduce abnormal discharge during sputtering. In addition, according to the sputtering target of the present embodiment, since the amount of pores is reduced, it is possible to provide a semiconductor device having excellent characteristics such as capable of maintaining a high field-effect mobility even if it is annealed at a high temperature.

The sputtering target is used as a raw material in the sputtering method. The sputtering method is such a method in which a sputtering target and a substrate are disposed facing each other in a film deposition chamber, a voltage is applied to the sputtering target, which causes rare gas ions to sputter against the surface of the target so as to knock out atoms constituting the target from the target, and the atoms are deposited on the substrate to form a film composed of the atoms constituting the target.

In the sputtering method, the voltage applied to the sputtering target may be a direct current voltage. In this case, it is desired that the sputtering target is conductive. If the sputtering target has a high electric resistance, it is impossible to apply the direct voltage, which makes it impossible to perform the film formation (the formation of an oxide semiconductor film) by the sputtering method. For an oxide sintered material used as a sputtering target, if a partial region thereof has a high electric resistance and the region is wide, since no direct current voltage is applied to the region having a high electric resistance, resulting in a problem such as that the region may not be sputtered appropriately. In other words, abnormal discharge called arcing may occur in the region with a high electric resistance, resulting in a problem such as that the film formation may not be performed appropriately.

The pores in the oxide sintered material are vacancies, each of which contains gas such as nitrogen, oxygen, carbon dioxide, moisture or the like. When such oxide sintered material is used as a sputtering target, the gas is released from the pores in the oxide sintered material, degrading the degree of vacuum of the sputtering apparatus, which consequently deteriorates the characteristics of the obtained oxide semiconductor film, or alternatively causing abnormal discharge to occur from the edge of the pore. Therefore, it is preferred to use an oxide sintered material with a small amount of pores as the sputtering target.

In order to be suitably used in a sputtering method so as to form an oxide semiconductor film of a semiconductor device capable of maintaining a high field-effect mobility even when it is annealed at a high temperature, the sputtering target according to the present embodiment preferably includes the oxide sintered material of Embodiment 1, and more preferably it is made of the oxide sintered material of Embodiment 1.

Embodiment 4: Semiconductor Device and Manufacturing Method Thereof

Figure 1B:
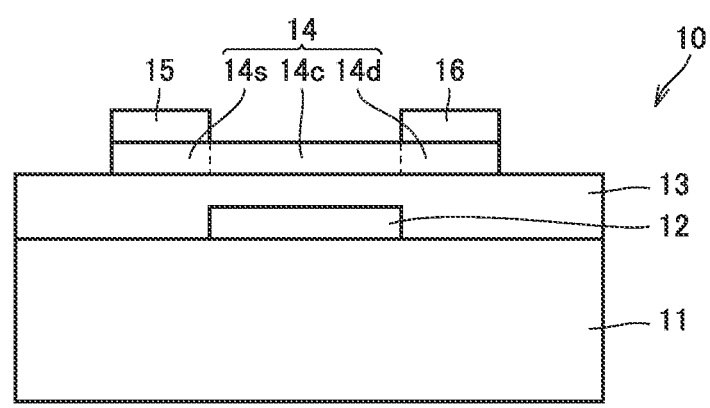
FIG. 1B is a schematic cross-sectional view taken along a line IB-IB illustrated in FIG. 1A.

Referring to FIGS. 1A and 1B, a semiconductor device 10 according to the present embodiment includes an oxide semiconductor film 14 formed by a sputtering method using the sputtering target of Embodiment 3. Since the semiconductor device according to the present embodiment includes the oxide semiconductor film 14, it may have excellent characteristics such as capable of maintaining a high field-effect mobility even if it is annealed at a high temperature.

The semiconductor device 10 according to the present embodiment is not particularly limited, but it is preferably a TFT (Thin Film Transistor), for example, which makes it possible to maintain the field-effect mobility high even if it is annealed at a high temperature. The oxide semiconductor film 14 included in the TFT is preferably a channel layer, which makes it possible to maintain the field-effect mobility high even if it is annealed at a high temperature.

The oxide semiconductor 14 may further contain zirconium (Zr), and the content thereof may be, for example, $1 \times 10^{17}$ atm/cm$^3$ or more and $1 \times 10^{20}$ atm/cm$^3$ or less. Element Zr may be contained in the oxide sintered material. The oxide semiconductor film 14 formed by using an oxide sintered material containing Zr as a raw material contains Zr. The presence of Zr is preferable from the viewpoint that the field-effect mobility may be kept high even if it is annealed at a high temperature.

The presence and the content of Zr may be determined by using a secondary ion mass spectrometer.

In the semiconductor device of the present embodiment, the oxide semiconductor film 14 preferably has an electrical resistivity of $10^{-1}$ Ωcm or more. Although many transparent conductive films containing indium oxide have been investigated so far, in the application of a transparent conductive film, it is required that the electrical resistivity thereof is smaller than $10^{-1}$ Ωcm. On the other hand, since the oxide semiconductor film 14 included in the semiconductor device of the present embodiment preferably has an electrical resistivity of $10^{-1}$ Ωcm or more, it may be suitably used as a channel layer of a semiconductor device. If a film has an electrical resistivity smaller than $10^{-1}$ Ωcm, it is difficult for it to be used as a channel layer of a semiconductor device.

The oxide semiconductor film 14 may be obtained by a manufacturing method including a step of forming a film according to the sputtering method. The sputtering method has been described in the above.

A magnetron sputtering method, a facing target magnetron sputtering method or the like may be used as the sputtering method. As the atmosphere gas for the sputtering, Ar gas, Kr gas or Xe gas may be used, and oxygen may be mixed with these gases.

Further, it is preferable that the oxide semiconductor film 14 is subjected to a heat treatment (annealing) after the film formation by the sputtering method. The oxide semiconductor film 14 obtained by this method is advantageous since it is possible for a semiconductor device (for example, a TFT) including the oxide semiconductor film as a channel layer to maintain the field-effect mobility high even if it is annealed at a high temperature.

The heat treatment after the film formation by the sputtering method may be performed by heating the semiconductor device. In order to obtain high characteristics when it is used as a semiconductor device, it is preferable to perform the heat treatment. The heat treatment may be performed immediately after forming the oxide semiconductor film 14 or after forming a source electrode, a drain electrode, an etch stopper layer (ES layer), a passivation film and the like. In order to obtain high characteristics when it is used as a semiconductor device, it is more preferable to perform the heat treatment after forming the etch stopper layer.

If the heat treatment is performed after forming the oxide semiconductor film 14, the substrate temperature is preferably 100° C. or more and 500° C. or less. The atmosphere for the heat treatment may be any atmosphere such as air atmosphere, nitrogen gas, nitrogen gas-oxygen gas, Ar gas, Ar-oxygen gas, water vapor-containing atmosphere, water vapor-containing nitrogen or the like. The pressure of the atmosphere may be air pressure, under a depressurized condition (for example, less than 0.1 Pa from normal pressure), or under a pressurized condition (for example, 0.1 Pa to 9 MPa over normal pressure), but it is preferably air pressure. The time for the heat treatment may be, for example, about 3 minutes to 2 hours, and preferably about 10 minutes to 90 minutes.

In order to obtain higher characteristics (for example, reliability) when it is used as a semiconductor device, it is desirable that the heat treatment is performed at a higher temperature. However, if the temperature for the heat treatment is raised, the field-effect mobility of the In—Ga—Zn—O-based oxide semiconductor film may be deteriorated. However, if a semiconductor device (for example, a TFT) includes, as a channel layer, the oxide semiconductor film 14 obtained by the sputtering method using the oxide sintered material according to Embodiment 1 as a sputtering target, it is possible for the semiconductor device to maintain a high field-effect mobility even if it is annealed at a high temperature, which is advantageous.

FIGS. 1A, 1B, 2 and 3 are schematic diagrams illustrating some examples of a semiconductor device (TFT) according to the present embodiment. The semiconductor device 10 illustrated in FIGS. 1A and 1B includes a substrate 11, a gate electrode 12 disposed on the substrate 11, a gate insulating film 13 disposed as an insulating layer on the gate electrode 12, a gate insulating film 13, the oxide semiconductor film 14 disposed as a channel layer on the gate insulating film 13, and a source electrode 15 and a drain electrode 16 disposed on the oxide semiconductor film 14 without contacting each other.

Figure 2:
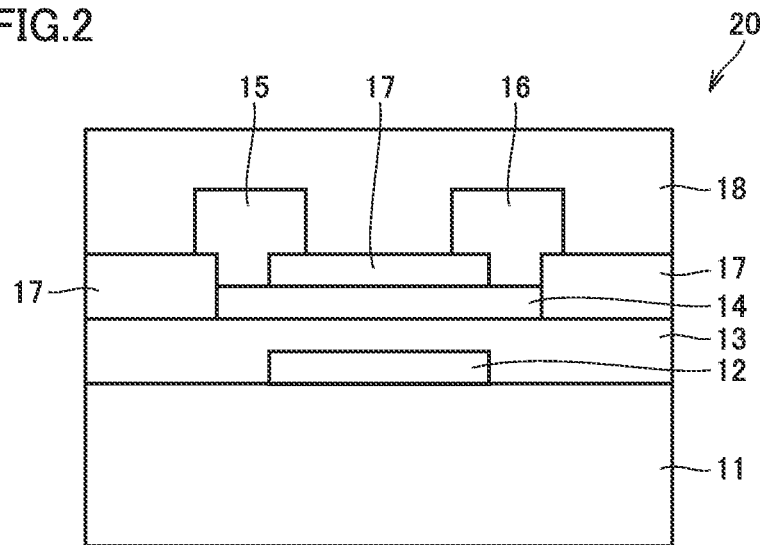
FIG. 2 is a schematic cross-sectional view illustrating another exemplary semiconductor device according to an embodiment of the present invention.
Figure 3:
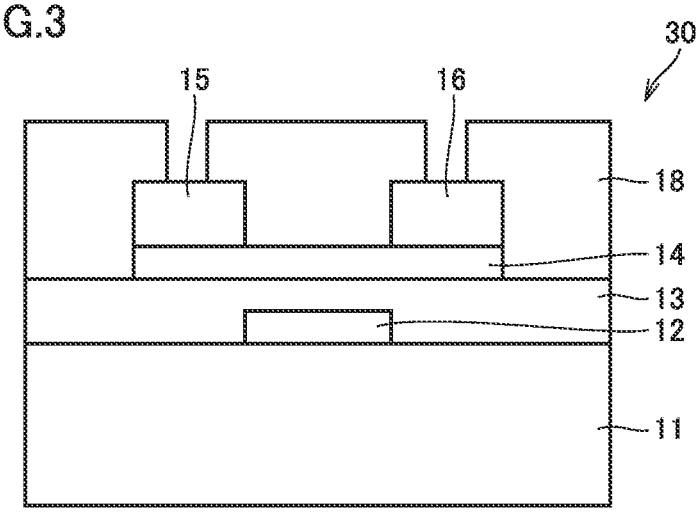
FIG. 3 is a schematic cross-sectional view illustrating still another exemplary semiconductor device according to an embodiment of the present invention.

A semiconductor device 20 illustrated in FIG. 2 is the same as the semiconductor device 10 illustrated in FIGS. 1A and 1B except that it further includes an etch stopper layer 17 which is disposed on the gate insulating film 13 and the oxide semiconductor film 14 and is provided with a contact hole, and a passivation film 18 which is disposed on the etch stopper layer 17, the source electrode 15 and the drain electrode 16. Similar to the semiconductor device 10 illustrated in FIGS. 1A and 1B, the passivation film 18 may not be disposed in the semiconductor device 20 illustrated in FIG. 2. A semiconductor device 30 illustrated in FIG. 3 is the same as the semiconductor device 10 illustrated in FIGS. 1A and 1B except that it further includes a passivation film 18 disposed on the gate insulating film 13, the source electrode 15 and the drain electrode 16.

Next, an exemplary method of manufacturing the semiconductor device according to the present embodiment will be described. The method of manufacturing the semiconductor device includes a step of preparing the sputtering target of the above embodiment and a step of forming the oxide semiconductor film by a sputtering method using the sputtering target. First, the method of manufacturing the semiconductor device 10 illustrated in FIGS. 1A and 1B will be described. Although the manufacturing method is not particularly limited, from the viewpoint of efficiently manufacturing the semiconductor device 10 with high characteristics, with reference to FIGS. 4A to 4D, it is preferred that the manufacturing method includes a step of forming the gate electrode 12 on the substrate 11 (FIG. 4A), a step of forming the gate insulating film 13 as a insulating layer on the gate electrode 12 and the substrate 11 (FIG. 4B), a step of forming the oxide semiconductor film 14 as a channel layer on the gate insulating film 13 (FIG. 4C), and a step of forming the source electrode 15 and the drain electrode 16 on the oxide semiconductor film 14 without contacting each other (FIG. 4D).

(1) Step of Forming Gate Electrode

Figure 4A:
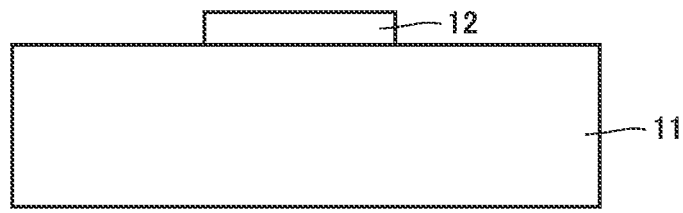
FIG. 4A is a schematic cross-sectional view illustrating an exemplary method of manufacturing the semiconductor device illustrated in FIGS. 1A and 1B.

With reference to FIG. 4A, the gate electrode 12 is formed on the substrate 11. The substrate 11 is not particularly limited, but from the viewpoint of improving the transparency, the price stability and the surface smoothness, it is preferably a quartz glass substrate, a non-alkali glass substrate, an alkali glass substrate or the like. The gate electrode 12 is not particularly limited, but from the viewpoint of having a high oxidation resistance and a low electric resistance, it is preferably a Mo electrode, a Ti electrode, a W electrode, an Al electrode, a Cu electrode or the like. The method of forming the gate electrode 12 is not particularly limited, but from the viewpoint of uniformly forming the gate electrode 12 with a large area on the main surface of the substrate 11, it is preferable to use a vacuum vapor deposition method, a sputtering method or the like. As illustrated in FIG. 4A, in the case of forming the gate electrode 12 partially on the surface of the substrate 11, an etching method using a photoresist may be adopted.

(2) Step of Forming Gate Insulating Film

Figure 4B:
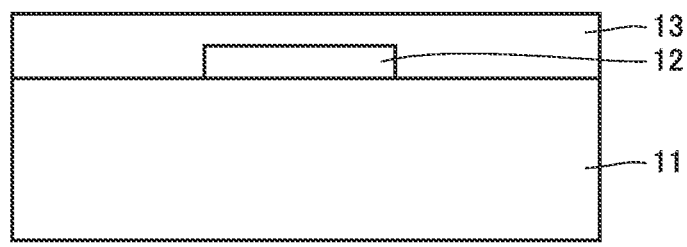
FIG. 4B is a schematic cross-sectional view illustrating an exemplary method of manufacturing the semiconductor device illustrated in FIGS. 1A and 1B.

With reference to FIG. 4B, the gate insulating film 13 is formed as an insulating layer on the gate electrode 12 and the substrate 11. The method of forming the gate insulating film 13 is not particularly limited, but from the viewpoint of uniformly forming the gate insulating film 13 with a large area and ensuring the insulating property, it is preferable to use a plasma CVD (Chemical Vapor Deposition) method or the like.

The material for the gate insulating film 13 is not particularly limited, but from the viewpoint of ensuring the insulating property, it is preferably silicon oxide ($SiO_x$), silicon nitride ($SiN_y$) or the like.

(3) Step of Forming Oxide Semiconductor Film

Figure 4C:
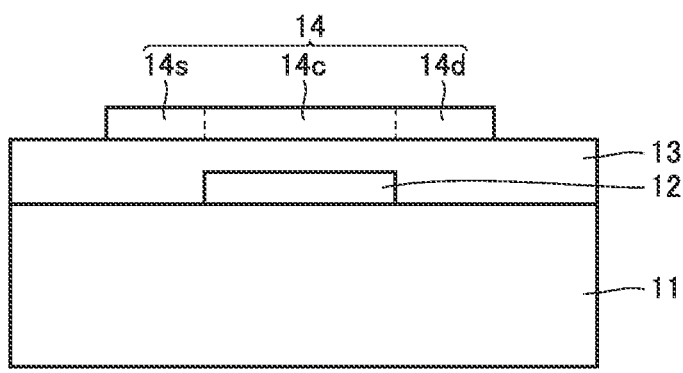
FIG. 4C is a schematic cross-sectional view illustrating an exemplary method of manufacturing the semiconductor device illustrated in FIGS. 1A and 1B.
Figure 4D:
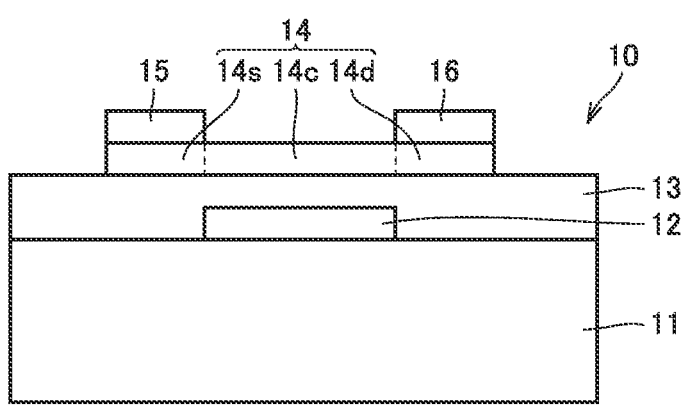
FIG. 4D is a schematic cross-sectional view illustrating an exemplary method of manufacturing the semiconductor device illustrated in FIGS. 1A and 1B.

With reference to FIG. 4C, the oxide semiconductor film 14 is formed as a channel layer on the gate insulating film 13. As described above, the oxide semiconductor film 14 is formed in a film formation process by the sputtering method. As the raw material target (sputtering target) for the sputtering method, the oxide sintered material of Embodiment 1 is used.

In order to obtain high characteristics (for example, reliability) when it is used as a semiconductor device, it is preferable to perform a heat treatment (annealing) after the film formation by the sputtering method. The heat treatment may be performed immediately after the formation of the oxide semiconductor film 14 or after forming the source electrode 15, the drain electrode 16, the etch stopper layer 17, the passivation film 18 or the like. In order to obtain high characteristics (for example, reliability) when it is used as a semiconductor device, it is more preferable to perform the heat treatment after forming the etch stopper layer 17. If the heat treatment is performed after forming the etch stopper layer 17, the heat treatment may be performed before or after the formation of the source electrode 15 and the drain electrode 16, but preferably before the formation of the passivation film 18.

(4) Step of Forming Source Electrode and Drain Electrode

With reference to FIG. 4D, the source electrode 15 and the drain electrode 16 are formed on the oxide semiconductor film 14 without contacting each other. Each of the source electrode 15 and the drain electrode 16 is not particularly limited, but from the viewpoint of having a high oxidation resistance, a low electric resistance and a low contact electric resistance with the oxide semiconductor film 14, it is preferably a Mo electrode, a Ti electrode, a W electrode, an Al electrode, a Cu electrode or the like. The method of forming the source electrode 15 and the drain electrode 16 is not particularly limited, but from the viewpoint of uniformly forming the source electrode 15 and the drain electrode 16 with a large area on the oxide semiconductor film 14 formed on the main surface of the substrate 11, it is preferable to use a vacuum vapor deposition method, a sputtering method or the like. The method of forming the source electrode 15 and the drain electrode 16 without contacting each other is not particularly limited, but from the viewpoint of forming a uniform pattern of the source electrode 15 and the drain electrode 16 with a large area, an etching method using a photoresist is preferable.

Figure 5A:
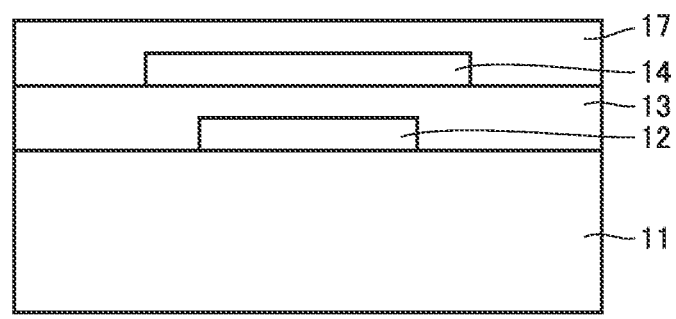
FIG. 5A is a schematic cross-sectional view illustrating an exemplary method of manufacturing the semiconductor device illustrated in FIG. 2.

Next, a method of manufacturing the semiconductor device 20 illustrated in FIG. 2 will be described. The method of manufacturing the semiconductor device 20 is the same as the method of manufacturing the semiconductor device 10 illustrated in FIGS. 1A and 1B except that it further includes a step of forming the etch stopper layer 17 provided with a contact hole 17a and a step of forming the passivation film 18. Specifically, with reference to FIGS. 4A to 4D and FIGS. 5A to 5D, it is preferable that the method of manufacturing the semiconductor device 20 includes a step of the gate electrode 12 on the substrate 11 (FIG. 4A), a step of forming the gate insulating film 13 as an insulating layer on the gate electrode 12 and the substrate 11 (FIG. 4B), a step of forming the oxide semiconductor film 14 as a channel layer on the gate insulating film 13 (FIG. 4C), a step of forming the etch stopper layer 17 on the oxide semiconductor film 14 and the gate insulating film 13 (FIG. 5A), a step of forming the contact hole 17a in the etching stopper layer 17 (FIG. 5B), a step of forming the source electrode 15 and the drain electrode 16 on the oxide semiconductor film 14 and the etch stopper layer 17 without contacting each other (FIG. 5C), and a step of forming the passivation film 18 on the etch stopper layer 17, the source electrode 15 and the drain electrode 16 (FIG. 5D).

The material for the etch stopper layer 17 is not particularly limited, but from the viewpoint of ensuring the insulating property, it is preferably silicon oxide ($SiO_x$), silicon nitride ($SiN_y$), aluminum oxide ($Al_mO_n$) or the like. The etch stopper layer 17 may be a combination of films made of different materials. The method of forming the etch stopper layer 17 is not particularly limited, but from the viewpoint of uniformly forming the etch stopper layer 17 with a large area and ensuring the insulation property, it is preferable to use a plasma CVD (Chemical Vapor Deposition) method, a sputtering method, a vacuum vapor deposition method or the like.

Figure 5B:
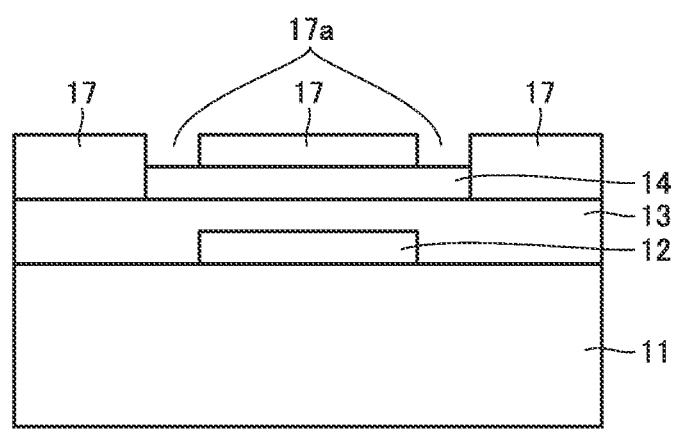
FIG. 5B is a schematic cross-sectional view illustrating an exemplary method of manufacturing the semiconductor device illustrated in FIG. 2.
Figure 5C:
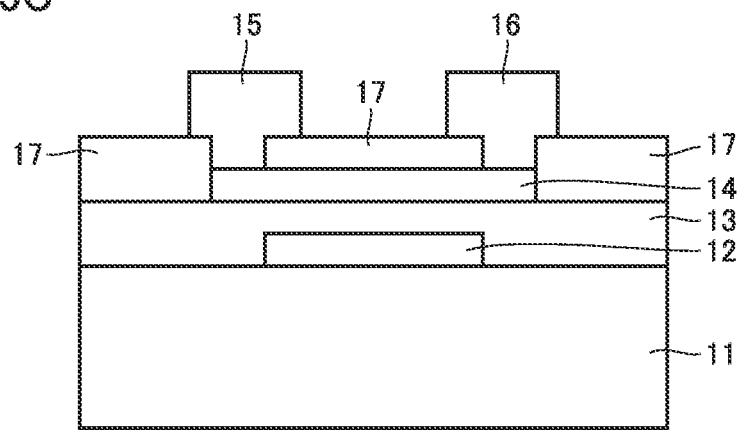
FIG. 5C is a schematic cross-sectional view illustrating an exemplary method of manufacturing the semiconductor device illustrated in FIG. 2.

Since it is necessary to bring the source electrode 15 and the drain electrode 16 into contact with the oxide semiconductor film 14, after forming the etch stopper layer 17 on the oxide semiconductor film 14, the contact hole 17a is formed in the etch stopper layer 17 (FIG. 5B). As a method of forming the contact hole 17a, a dry etching method or a wet etching method may be given. By etching the etch stopper layer 17 according to the dry etching method or the wet etching method so as to form the contact hole 17a, the surface of the oxide semiconductor film 14 is exposed at the etched portion.

Figure 5D:
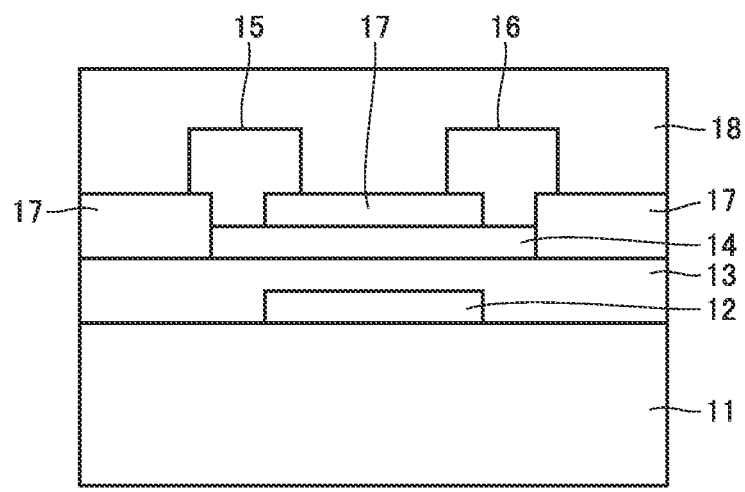
FIG. 5D is a schematic cross-sectional view illustrating an exemplary method of manufacturing the semiconductor device illustrated in FIG. 2.

In the method of manufacturing the semiconductor device 20 illustrated in FIG. 2, similar to the manufacturing method of the semiconductor device 10 illustrated in FIGS. 1A and 1B, after the source electrode 15 and the electrodes 16 are formed on the oxide semiconductor film 14 and the etch stopper layer 17 without contacting each other (FIG. 5C), the passivation film 18 is formed on the etch stopper layer 17, the source electrode 15 and the drain electrode 16 (FIG. 5D).

The material for the passivation film 18 is not particularly limited, but from the viewpoint of ensuring the insulating property, it is preferably silicon oxide ($SiO_x$), silicon nitride ($SiN_y$), aluminum oxide ($Al_mO_n$) or the like. The passivation film 18 may be a combination of films made of different materials. The method of forming the passivation film 18 is not particularly limited, but from the viewpoint of uniformly forming the passivation film 18 with a large area and ensuring the insulation property, it is preferable to use a plasma CVD (Chemical Vapor Deposition) method, a sputtering method, a vacuum vapor deposition method or the like.

Further, as the semiconductor device 30 illustrated in FIG. 3, it is acceptable that a back channel etch (BCE) structure is adopted, and instead of forming the etch stopper layer 17, the passivation film 18 is directly formed on the gate insulating film 13, the oxide semiconductor film 14, the source electrode 15 and the drain electrode 16. In this case, the passivation film 18 may be the same as the passivation film 18 of the semiconductor device 20 illustrated in FIG. 2.

(5) Other Steps

Finally, the heat treatment (annealing) is performed. The heat treatment may be carried out by heating the semiconductor device formed on the substrate.

The temperature for heating the semiconductor device in the heat treatment is preferably 100° C. or more and 500° C. or less, and more preferably 400° C. or more. The atmosphere for the heat treatment may be any atmosphere such as air atmosphere, nitrogen gas, nitrogen gas-oxygen gas, Ar gas, Ar-oxygen gas, water vapor-containing atmosphere, water vapor-containing nitrogen or the like. Preferably, it is an inert atmosphere such as nitrogen or Ar gas. The pressure of the atmosphere may be air pressure, under a depressurized condition (for example, less than 0.1 Pa), or under a pressurized condition (for example, 0.1 Pa to 9 MPa), but it is preferably air pressure. The time for the heat treatment may be, for example, about 3 minutes to 2 hours, and preferably about 10 minutes to 90 minutes.

In order to obtain higher characteristics (for example, reliability) when it is used as a semiconductor device, it is desirable that the heat treatment is performed at a higher temperature. However, if the temperature for the heat treatment is raised, the field-effect mobility of the In—Ga—Zn—O-based oxide semiconductor film may be deteriorated. However, if a semiconductor device (for example, a TFT) includes, as a channel layer, the oxide semiconductor film 14 obtained by the sputtering method using the oxide sintered material according to Embodiment 1 as a sputtering target, it is possible for the semiconductor device to maintain a high field-effect mobility even if it is annealed at a high temperature, which is advantageous.

EXAMPLES

Examples 1 to 22

(1) Production of Oxide Sintered Material (1-1) Preparation of Raw Powders

The following powders were prepared: a tungsten oxide powder (denoted as "W" in Table 1) having a composition (listed in the column of "W powder" in Table 1), a median particle size d50 (denoted as in the column of "W Particle Size" in Table 1) and a purity of 99.99 mass %; a ZnO powder (denoted as "Z" in Table 1) having a median particle size d50 of 1.0 µm and a purity of 99.99 mass %; an $In_2O_3$ powder (denoted as "I" in Table 1) having a median particle size d50 of 1.0 µm and a purity of 99.99 mass %; and a $ZrO_2$ powder (denoted as "R" in Table 1) having a median particle size d50 of 1.0 µm and a purity of 99.99 mass %.

(1-2) Preparation of Raw Powder Mixture

The prepared raw powders, i.e., the $In_2O_3$ powder, the ZnO powder, the tungsten oxide powder and the $ZrO_2$ powder were firstly charged into a pot and then introduced into a ball mill, pulverized and mixed for 12 hours to prepare a raw powder mixture. The mixing ratio of the raw powders was set such that the molar ratio of In, Zn, W and Zr in the mixture was as shown in Table 1. During the pulverization and mixing, pure water was used as a dispersion medium. The obtained raw powder mixture was dried by spray drying.

(1-3) Formation of Molded Body by Molding Mixture

Next, the obtained raw powder mixture was molded by pressing, and then press-molded according to the CIP method in static water at room temperature (5° C. to 30° C.)

under a pressure of 190 MPa to obtain a disk-shaped molded body having a diameter of 100 mm and a thickness of about 9 mm.

(1-4) Formation of Oxide Sintered Material by Sintering Molded Body (Sintering Step)

Next, the obtained molded body was sintered for 8 hours at a sintering temperature (the second temperature) shown in Table 1 in an air atmosphere under atmospheric pressure to obtain an oxide sintered material containing an $In_2O_3$ crystal phase, a $Zn_4In_2O_7$ crystal phase and a $ZnWO_4$ crystal phase. The retention temperature (the first temperature) and the retention time in the heating process of the sintering step are shown in Table 1.

(2) Evaluation of Physical Properties of Oxide Sintered Material (2-1) Identification of $In_2O_3$ Crystal Phase, $Zn_4In_2O_7$ Crystal Phase and $ZnWO_4$ Crystal Phase A sample was taken from a portion having a depth of 2 mm or more from the outermost surface of the obtained oxide sintered material and subjected to crystal analysis by X-ray diffraction method. The measurement conditions for X-ray diffraction were as follows.

(Measurement Conditions of X-Ray Diffraction)
θ-2θ method,
X-ray source: Cu Kα ray,
X-ray tube voltage: 45 kV,
X-ray tube current: 40 mA,
Step width: 0.02°,
Step time: 1 second/step,
Measurement range 2θ:10° to 80°.

According to the identification of the diffraction peaks, it was confirmed that the oxide sintered material of each of Examples 1 to 22 contains all of the $In_2O_3$ crystal phase, the $Zn_4In_2O_7$ crystal phase and the $ZnWO_4$ crystal phase.

(2-2) X-ray Diffraction Peak Derived from $In_2O_3$ Crystal Phase

According to the X-ray diffraction measurement described in the above (2-1), the diffraction angle 2θ at the X-ray diffraction peak derived from the $In_2O_3$ crystal phase was determined. The results are shown in the column of "I angle" in Table 2. The diffraction angle 2θ at the X-ray diffraction peak derived from the $In_2O_3$ crystal phase in the oxide sintered material of each of Examples 1 to 22 was greater than 50.70° and smaller than 51.04°.

(2-3) Lattice Constant of C-plane of $Zn_4In_2O_7$ Crystal Phase

According to the X-ray diffraction measurement described in the above (2-1), the lattice constant of the C-plane of the $Zn_4In_2O_7$ crystal phase was determined. The diffraction peak from the C-plane of the $Zn_4In_2O_7$ crystal phase may appear in the range of 2θ=31.5° or more and less than 32.8°. The lattice constant of the C-plane was calculated from the diffraction angle 2θ at the maximum peak position according to the equation of $2d\sin\theta=\lambda$ (Bragg's equation), wherein λ is the wavelength of the X-ray. The results are shown in the column of "C-plane" in Table 2. The lattice constant of the C-plane of the $Zn_4In_2O_7$ crystal phase in the oxide sintered material of each of Examples 1 to 22 was 33.53 Å or more and 34.00 Å or less.

(2-4) Content of Each Crystal Phase

According to the RIR method based on the X-ray diffraction measurement described in the above (2-1), the content (mass %) of each of the $In_2O_3$ crystal phase (I crystal phase), the $Zn_4In_2O_7$ crystal phase (IZ crystal phase) and the $ZnWO_4$ crystal phase (ZW crystal phase) was quantified. The results are shown as in "I", "IZ" and "ZW" under the column of "content of crystal phase" in Table 2, respectively.

(2-5) Element Content in Oxide Sintered Material

The contents of In, Zn, W and Zr in the oxide sintered material were measured by ICP emission spectrometry. Further, the Zn/W ratio (the ratio of the Zn content relative to the W content) was calculated from the obtained Zn content and W content. The results are shown in "In", "Zn", "W", "Zr", "Zn/W ratio" under the column of "element content" in Table 2, respectively. The unit of the In content, the Zn content and the W content is atom %, the unit of the Zr content is ppm based on the number of atoms, and the Zn/W ratio is the ratio of atom numbers.

(2-6) Amount of Pores in Oxide Sintered Material

A sample was taken from a portion having a depth of 2 mm or more from the outermost surface of the oxide sintered material immediately after sintering. The obtained sample was ground by using a surface grinding machine, the surface of the sample was polished by using a lapping machine, and finally polished by using a cross section polisher, and then subjected to SEM observation. The pores appears black in a backscattered electron image observed under a field of view of 500 times. The image was binarized, and the ratio of the area of the black portions relative to the whole area of the image was calculated. Three fields of view were selected such that the regions did not overlap, and the average value of the area ratios for these regions was calculated as the amount of pores (area %). The results are shown in the column of "amount of pores" in Table 2.

(3) Production of Sputtering Target

The obtained oxide sintered material was processed to have a size of 3 inches (76.2 mm) in diameter×6 mm in thickness, and then attached to a copper backing plate using indium metal.

(4) Production and Evaluation of Semiconductor Device (TFT) Including Oxide Semiconductor Film (4-1) Measurement of Arcing Frequency During Sputtering The produced sputtering target was placed in a film deposition chamber of a sputtering apparatus. The sputtering target was water cooled through the intermediary of the copper backing plate. The film deposition chamber was depressurized to have a degree of vacuum of about $6 \times 10^{-5}$ Pa, and the target was sputtered as follows.

Ar (argon) gas only was introduced into the film formation chamber until the inner pressure reached 0.5 Pa. DC power of 450 W was applied to the target so as to induce a sputtering discharge and held for 60 minutes. The sputtering discharge was continuously induced for 30 minutes. The arcing frequency for each of Examples and Comparative Examples shown in Table 2 was measured by using an arc counter (arcing frequency counting device) attached to the DC power supply. The results are shown in the column of "arcing frequency" in Table 3.

(4-2) Production of Semiconductor Device (TFT) Including Oxide Semiconductor Film A TFT having a similar structure to the semiconductor device 30 illustrated in FIG. 3 was produced by the following procedure. With reference to FIG. 4A, first, a synthetic quartz glass substrate having a dimension of 50 mm×50 mm×0.6 mm in thickness was prepared as the substrate 11, and a Mo electrode having a thickness of 100 nm was formed on the substrate 11 according to a sputtering method as the gate electrode 12. Next, as illustrated in FIG. 4A, the gate electrode 12 was processed into a predetermined shape through etching by using a photoresist.

Next, with reference to FIG. 4B, a $SiO_x$ film having a thickness of 200 nm was formed on the gate electrode 12 and the substrate 11 according to a plasma CVD method as the gate insulating film 13.

Next, with reference to FIG. 4C, the oxide semiconductor film 14 with a thickness of 30 nm was formed on the gate insulating film 13 according to the DC (direct current) magnetron sputtering method. A flat surface of the target with a diameter of 3 inches (76.2 mm) was used as the sputtering surface. The oxide sintered material obtained in the above (1) was used as the target.

The formation of the oxide semiconductor film 14 will be described in more detail. On a substrate holder which is water-cooled in the film deposition chamber of a sputtering apparatus (not shown), the substrate 11, on which the gate electrode 12 and the gate insulating film 13 are formed, was arranged in such a manner that the gate insulating film 13 was exposed. The target was disposed to face the gate insulating film 13 with a distance of 90 mm. The film deposition chamber was depressurized to have a degree of vacuum of about $6 \times 10^{-5}$ Pa, and the target was sputtered as follows.

First, in a state in which a shutter was inserted between the gate insulating film 13 and the target, a gas mixture of Ar (argon) gas and $O_2$ (oxygen) gas was introduced into the film formation chamber until the inner pressure reached 0.5 Pa. The content of $O_2$ gas in the gas mixture was 20% by volume. DC power 450 W was applied to the sputtering target to induce sputtering discharge so as to clean (pre-sputter) the surface of the target for 5 minutes.

Next, while the DC power of the same value as described in the above was being applied to the same target as described in the above and the atmosphere in the film formation chamber was maintained to be unchanged, the shutter was removed so as to form the oxide semiconductor film 14 on the gate insulating film 13. It should be noted that no bias voltage was particularly applied to the substrate holder. Moreover, the substrate holder was water cooled.

As described above, the oxide semiconductor film 14 was formed by the DC (direct current) magnetron sputtering method using the target manufactured from the oxide sintered material obtained in the above (1). The oxide semiconductor film 14 serves as a channel layer in the TFT. The film thickness of the oxide semiconductor film 14 was 30 nm (the same applies to the other examples and comparative examples).

Next, the obtained oxide semiconductor film 14 was partially etched to form a source electrode formation portion 14s, a drain electrode formation portion 14d, and a channel portion 14c. The size of the main surface of each of the source electrode formation portion 14s and the drain electrode formation portion 14d was set to 50 μm×50 μm, a channel length $C_L$ (with reference to FIG. 1A and FIG. 1B, the channel length $C_L$ refers to a distance of the channel portion 14c between the source electrode 15 and the drain electrode 16) was set to 30 μm, and a channel width $C_W$ (with reference to FIG. 1A and FIG. 1B, the channel width $C_W$ refers to the width of the channel portion 14c) was set to 40 μm. A number of 25 (at the longitudinal side)×25 (at the lateral side) of the channel portions 14c were disposed on the substrate main surface of 75 mm×75 mm at a spacing of 3 mm such that a number of 25 (at the longitudinal side)×25 (at the lateral side) of TFTs were disposed on the substrate main surface of 75 mm×75 mm at a spacing of 3 mm.

The oxide semiconductor film 14 was partially etched in the following manner: an etching aqueous solution was prepared to have a volume ratio of oxalic acid:water=5:95, the substrate 11 having the gate electrode 12, the gate insulating film 13 and the oxide semiconductor film 14 formed thereon in this order was immersed in the etching aqueous solution at 40° C.

With reference to FIG. 4D, the source electrode 15 and the drain electrode 16 were then formed on the oxide semiconductor film 14, separating from each other.

Specifically, first, a resist (not shown) was applied onto the oxide semiconductor film 14, exposed to light and developed so as to expose only the main surface of the oxide semiconductor film 14 corresponding to the source electrode formation portion 14s and the drain electrode formation portion 14d. Next, the sputtering method was employed to form Mo electrodes each having a thickness of 100 nm and serving as the source electrode 15 and the drain electrode 16 respectively on the main surface of the oxide semiconductor film 14 corresponding to the source electrode formation portion 14s and the drain electrode formation portion 14d. Then, the resist developed on the oxide semiconductor film 14 was removed. One Mo electrode serving as the source electrode 15 and one Mo electrode serving as the drain electrode 16 were formed for one channel portion 14c such that a number of 25 (at the longitudinal side)×25 (at the lateral side) of TFTs were disposed on the substrate main surface of 75 mm×75 mm at a spacing of 3 mm.

Next, with reference to FIG. 3, the passivation film 18 was formed on the gate insulating film 13, the oxide semiconductor film 14, the source electrode 15, and the drain electrode 16. The passivation film 18 was formed by forming a $SiO_x$ film with a thickness of 200 nm by the plasma CVD method and then a $SiN_y$ film with a thickness of 200 nm was formed thereon by the plasma CVD method. In order to improve reliability, it is desirable that the oxygen content should meet the condition that the atomic composition ratio of the $SiO_x$ film is closer to Si:O=1:2.

Next, the passivation film 18 on the source electrode 15 and the drain electrode 16 was etched by reactive ion etching to form a contact hole, thereby partially exposing the surface of the source electrode 15 and the surface of the drain electrode 16.

Finally, the heat treatment (annealing) was performed in nitrogen atmosphere under the atmospheric pressure. The heat treatment was performed for all Examples and Comparative Examples. Specifically, the heat treatment (annealing) was performed in nitrogen atmosphere at 350° C. for 60 minutes or in nitrogen atmosphere at 450° C. for 60 minutes. Thus, a TFT including the oxide semiconductor film 14 as a channel layer was obtained.

(4-3) Evaluation on Characteristics of Semiconductor Device

The characteristics of the TFT serving as the semiconductor device 10 were evaluated as follows. First, a measurement needle was brought into contact with the gate electrode 12, the source electrode 15 and the drain electrode 16, respectively. While a source-drain voltage $V_{ds}$ of 0.2 V was being applied between the source electrode 15 and the drain electrode 16, a source-gate voltage $V_{gs}$ applied between the source electrode 15 and the gate electrode 12 was varied from −10 V to 15 V to measure a source-drain current $I_{ds}$. Thereby, a graph was created with the horizontal axis representing the source-gate voltage $V_{gs}$ and the vertical axis representing the source-drain current $I_{ds}$.

Moreover, $g_m$ was derived by differentiating the source-drain current $I_{ds}$ with respect to the source-gate voltage $V_{gs}$ in accordance with the following formula [a]:

$$g_m = dI_{ds}/dV_{gs} \qquad [a]$$

Then, the value of $g_m$ when $V_{gs}$=10.0 V was used to determine the field effect mobility $\mu_{fe}$ based on the following formula [b]:

$$\mu_{fe}=g_m \cdot C_L/(C_W \cdot C_i \cdot V_{ds})$$ [b]

In the above formula [b], the channel length $C_L$ was 30 μm and the channel width $C_W$ was 40 μm. Moreover, the capacitance $C_i$ of the gate insulating film 13 was set to $3.4 \times 10^{-8}$ F/cm$^2$, and the source-drain voltage $V_{ds}$ was set to 0.2 V.

The field-effect mobility $\mu_{fe}$ after the heat treatment (annealing) at 350° C. for 60 minutes in the nitrogen atmosphere under the atmospheric pressure is shown in the column of "mobility (350° C.)" in Table 3, and the field-effect mobility $\mu_{fe}$ after the heat treatment (annealing) at 450° C. for 10 minutes in the nitrogen atmosphere under the atmospheric pressure is shown in the column of "mobility (450° C.)" in Table 3. Further, the ratio of the field-effect mobility after the heat treatment at 450° C. relative to the field-effect mobility after the heat treatment at 350° C. (ratio of mobility (450° C.)/mobility (350° C.)) is shown in the column of "mobility ratio" in Table 3.

Examples 23 to 25

(1) Production of Oxide Sintered Material
(1-1) Preparation of Raw Powders

The following powders were prepared: a tungsten oxide powder (denoted as "W" in Table 1) having a composition (listed in the column of "W powder" in Table 1), a median particle size d50 (denoted as in the column of "W Particle Size" in Table 1) and a purity of 99.99 mass %; a ZnO powder (denoted as "Z" in Table 1) having a median particle size d50 of 1.0 μm and a purity of 99.99 mass %; an In$_2$O$_3$ powder (denoted as "I" in Table 1) having a median particle size d50 of 1.0 μm and a purity of 99.99 mass %; and a ZrO$_2$ powder (denoted as "R" in Table 1) having a median particle size d50 of 1.0 μm and a purity of 99.99 mass %.

(1-2) Preparation of Primary Mixture of Raw Powders

First, the In$_2$O$_3$ powder and the ZnO powder among the prepared raw powders were introduced into a ball mill and were pulverized and mixed for 18 hours to prepare a primary mixture of the raw powders. The In$_2$O$_3$ powder and the ZnO powder were mixed such that the molar mixing ratio of the In$_2$O$_3$ powder:the ZnO powder=1:4 approximately. During the pulverization and mixing, ethanol was used as a dispersion medium. The obtained primary mixture of the raw powders was dried in air.

(1-3) Formation of Calcined Powder by Heating Primary Mixture

Next, the obtained primary mixture of the raw powders was charged into an alumina crucible and calcined in the air atmosphere for 8 hours at a calcination temperature shown in Table 1 to obtain a calcined powder composed of the Zn$_4$In$_2$O$_7$ crystal phase. The Zn$_4$In$_2$O$_7$ crystal phase was identified by X-ray diffraction measurement.

(1-4) Preparation of Secondary Mixture of Raw Powders Including Calcined Powder

Next, the obtained calcined powder was charged into a pot together with the remainder of the prepared raw powders, i.e., the In$_2$O$_3$ powder, the tungsten oxide powder and the ZrO$_2$ powder, which were then introduced into a pulverization mixing ball mill and were pulverized and mixed for 12 hours to prepare a secondary mixture of the raw powders. The mixing ratio of the raw powders was set such that the molar ratio of In, Zn, W and Zr in the mixture was as shown in Table 1. During the pulverization and mixing, pure water was used as a dispersion medium. The obtained mixed powder was dried by spray drying.

(1-5) Formation of Oxide Sintered Material

The oxide sintered material was prepared in the same manner as that described in the above (1-3) and (1-4) in <Examples 1 to 22> except that the secondary mixture obtained from the above (1-4) was used.

(2) Evaluation of Physical Properties of Oxide Sintered Material, Preparation of Sputtering Target, Production and Evaluation of Semiconductor Device (TFT) Including Oxide Semiconductor Film The evaluation of physical properties of the oxide sintered material, the preparation of a sputtering target, the production and evaluation of a semiconductor device (TFT) including an oxide semiconductor film were carried out in the same manner as that described in <Examples 1 to 22>. The results are shown in Table 2 and Table 3.

Comparative Example 1

(1-1) Preparation of Raw Powders

The following powders were prepared: a tungsten oxide powder (denoted as "W" in Table 1) having a composition (listed in the column of "W powder" in Table 1), a median particle size d50 (denoted as in the column of "W Particle Size" in Table 1) and a purity of 99.99 mass %; a ZnO powder (denoted as "Z" in Table 1) having a median particle size d50 of 1.0 μm and a purity of 99.99 mass %; an In$_2$O$_3$ powder (denoted as "I" in Table 1) having a median particle size d50 of 1.0 μm and a purity of 99.99 mass %; and a ZrO$_2$ powder (denoted as "R" in Table 1) having a median particle size d50 of 1.0 μm and a purity of 99.99 mass %.

(1-2) Preparation of Primary Mixture of Raw powders

First, the ZnO powder and the WO$_3$ powder among the prepared raw powders were introduced into a ball mill and were pulverized and mixed for 18 hours to prepare a primary mixture of the raw powders. The ZnO powder and the WO$_3$ powder were mixed such that the molar mixing ratio of the ZnO powder:the WO$_3$ powder=1:1 approximately. During the pulverization and mixing, ethanol was used as a dispersion medium. The obtained primary mixture of the raw powders was dried in air.

(1-3) Formation of Calcined Powder by Heating Primary Mixture

Next, the obtained primary mixture of the raw powders was charged into an alumina crucible and calcined in the air atmosphere for 8 hours at a calcination temperature shown in Table 1 to obtain a calcined powder composed of the ZnWO$_4$ crystal phase. The ZnWO$_4$ crystal phase was identified by X-ray diffraction measurement.

(1-4) Preparation of Secondary Mixture of Raw powders including Calcined Powder

Next, the obtained calcined powder was charged into a pot together with the remainder of the prepared raw powders, i.e., the In$_2$O$_3$ powder, the ZnO powder and the ZrO$_2$ powder, which were then introduced into a pulverization mixing ball mill and were pulverized and mixed for 12 hours to prepare a secondary mixture of the raw powders. The mixing ratio of the raw powders was set such that the molar ratio of In, Zn, W and Zr in the mixture was as shown in Table 1. During the pulverization and mixing, pure water was used as a dispersion medium. The obtained mixed powder was dried by spray drying.

(1-5) Formation of Oxide Sintered Material

The oxide sintered material was prepared in the same manner as that described in the above (1-3) and (1-4) in <Examples 1 to 22> except that the secondary mixture obtained from the above (1-4) was used and that no heating process is included in the sintering step.

(2) Evaluation of Physical Properties of Oxide Sintered Material, Preparation of Sputtering Target, Production and Evaluation of Semiconductor Device (TFT) Including Oxide Semiconductor Film The evaluation of physical properties of the oxide sintered material, the preparation of a sputtering target, the production and evaluation of a semiconductor device (TFT) including an oxide semiconductor film were carried out in the same manner as that described in <Examples 1 to 22>. The results are shown in Table 2 and Table 3. The presence of the $Zn_4In_2O_7$ crystal phase was not confirmed in the oxide sintered material of Comparative Example 1.

Comparative Example 2

(1-1) Preparation of Raw Powders

The following powders were prepared: a tungsten oxide powder (denoted as "W" in Table 1) having a composition (listed in the column of "W powder" in Table 1), a median particle size d50 (denoted as in the column of "W Particle Size" in Table 1) and a purity of 99.99 mass %; a ZnO powder (denoted as "Z" in Table 1) having a median particle size d50 of 1.0 μm and a purity of 99.99 mass %; an $In_2O_3$ powder (denoted as "I" in Table 1) having a median particle size d50 of 1.0 μm and a purity of 99.99 mass %; and a $ZrO_2$ powder (denoted as "R" in Table 1) having a median particle size d50 of 1.0 μm and a purity of 99.99 mass %.

(1-2) Preparation of Primary Mixture of Raw Powder

First, the $In_2O_3$ powder and the $WO_3$ powder among the prepared raw powders were introduced into a ball mill and were pulverized and mixed for 18 hours to prepare a primary mixture of the raw powders. The molar mixing ratio of the $In_2O_3$ powder and the $WO_3$ powder were mixed such that the molar mixing ratio of the $In_2O_3$ powder:the $WO_3$ powder=1: 12 approximately. During the pulverization and mixing, ethanol was used as a dispersion medium. The obtained primary mixture of the raw powders was dried in air.

(1-3) Formation of Calcined Powder by Heating of Primary Mixture

Next, the obtained primary mixture of the raw powders was charged into an alumina crucible and calcined in the air atmosphere for 8 hours at a calcination temperature shown in Table 1 to obtain a calcined powder composed of the In $W_6O_{12}$ crystal phase. The $InW_6O_{12}$ crystal phase was identified by X-ray diffraction measurement.

(1-4) Preparation of Secondary Mixture of Raw Powder Containing Calcined Powder

Next, the obtained calcined powder was charged into a pot together with the remainder of the prepared raw powders, i.e., the $In_2O_3$ powder, the ZnO powder and the $ZrO_2$ powder, which were then introduced into a pulverization mixing ball mill and were pulverized and mixed for 12 hours to prepare a secondary mixture of the raw powders. The mixing ratio of the raw powders was set such that the molar ratio of In, Zn, W and Zr in the mixture was as shown in Table 1. During the pulverization and mixing, pure water was used as a dispersion medium. The obtained mixed powder was dried by spray drying.

(1-5) Formation of Oxide Sintered Material

The oxide sintered material was prepared in the same manner as that described in the above (1-3) and (1-4) in <Examples 1 to 22> except that the secondary mixture obtained from the above (1-4) was used and that no heating process is included in the sintering step.

(2) Evaluation of Physical Properties of Oxide Sintered Material, Preparation of Sputtering Target, Production and Evaluation of Semiconductor Device (TFT) Including Oxide Semiconductor Film The evaluation of physical properties of the oxide sintered material, the preparation of a sputtering target, the production and evaluation of a semiconductor device (TFT) including an oxide semiconductor film were carried out in the same manner as that described in <Examples 1 to 22>. The results are shown in Table 2 and Table 3. The presence of the $Zn_4In_2O_7$ crystal phase was not confirmed in the oxide sintered material of Comparative Example 2.

Comparative Example 3

(1) Production of Oxide Sintered Material (1-1) Preparation of Raw Powders

The following powders were prepared: a tungsten oxide powder (denoted as "W" in Table 1) having a composition (listed in the column of "W powder" in Table 1), a median particle size d50 (denoted as in the column of "W Particle Size" in Table 1) and a purity of 99.99 mass %; a ZnO powder (denoted as "Z" in Table 1) having a median particle size d50 of 1.0 μm and a purity of 99.99 mass %; an $In_2O_3$ powder (denoted as "I" in Table 1) having a median particle size d50 of 1.0 μm and a purity of 99.99 mass %; and a $ZrO_2$ powder (denoted as "R" in Table 1) having a median particle size d50 of 1.0 μm and a purity of 99.99 mass %.

(1-2) Preparation of Mixture of Raw Powders

The prepared raw powders were charged into a pot, then introduced into a ball mill and were pulverized and mixed for 12 hours to prepare a mixture of the raw powders. The mixing ratio of the raw powders was set such that the molar ratio of In, Zn, W and Zr in the mixture was as shown in Table 1. During the pulverization and mixing, pure water was used as a dispersion medium. The obtained mixed powder was dried by spray drying.

(1-3) Formation of Oxide Sintered Material

The oxide sintered material was prepared in the same manner as that described in the above (1-3) and (1-4) in <Examples 1 to 22> except that the secondary mixture obtained from the above (1-4) was used and that no heating process is included in the sintering step.

(2) Evaluation of Physical Properties of Oxide Sintered Material, Preparation of Sputtering Target, Production and Evaluation of Semiconductor Device (TFT) Including Oxide Semiconductor Film The evaluation of physical properties of the oxide sintered material, the preparation of a sputtering target, the production and evaluation of a semiconductor device (TFT) including an oxide semiconductor film were carried out in the same manner as that described in <Examples 1 to 22>. The results are shown in Table 2 and Table 3. The presence of the $Zn_4In_2O_7$ crystal phase was not confirmed in the oxide sintered material of Comparative Example 3.

TABLE 1

| | Molar Mixing Ratio | | | | W Particle Size (μm) | Calcination Temperature (° C.) | Retention Temperature (First Temperature) (° C.) | Retention Time (min) | Sintering Temperature (Second Temperature) (° C.) |
|---|---|---|---|---|---|---|---|---|---|
| | I (mole %) | Z (mole %) | W (mole %) | R (mole %) W Powder | | | | | |
| Example 1 | 94.7 | 3.9 | 1.4 | 0.049 WO$_{2.72}$ | 1.2 | — | 600 | 60 | 1185 |
| Example 2 | 68.5 | 30.3 | 1.2 | 0.025 WO$_{2.72}$ | 1.1 | — | 600 | 60 | 1185 |
| Example 3 | 65.7 | 33.1 | 1.2 | 0.025 WO$_{2.72}$ | 1.1 | — | 600 | 60 | 1185 |
| Example 4 | 50.7 | 48.2 | 1.1 | 0.023 WO$_{2.72}$ | 1 | — | 600 | 60 | 1185 |
| Example 5 | 93.8 | 3.9 | 2.3 | 0.048 WO$_{2.72}$ | 1.2 | — | 600 | 60 | 1185 |
| Example 6 | 67.8 | 30.2 | 2.0 | 0.025 WO$_{2.72}$ | 1.1 | — | 600 | 60 | 1185 |
| Example 7 | 65.0 | 33.0 | 2.0 | 0.041 WO$_{2.72}$ | 1.1 | — | 600 | 60 | 1185 |
| Example 8 | 50.1 | 48.0 | 1.8 | 0.023 WO$_{2.72}$ | 1 | — | 600 | 60 | 1185 |
| Example 9 | 92.3 | 3.8 | 3.8 | 0.048 WO$_{2.72}$ | 1.5 | — | 600 | 60 | 1185 |
| Example 10 | 92.1 | 3.8 | 3.8 | 0.211 WO$_3$ | 0.8 | — | 600 | 60 | 1185 |
| Example 11 | 78.5 | 17.8 | 3.6 | 0.045 WO$_{2.72}$ | 0.9 | — | 600 | 60 | 1185 |
| Example 12 | 66.6 | 30.0 | 3.3 | 0.075 WO$_{2.72}$ | 1 | — | 600 | 60 | 1185 |
| Example 13 | 66.6 | 30.0 | 3.3 | 0.042 WO$_{2.72}$ | 0.9 | — | 600 | 60 | 1185 |
| Example 14 | 63.9 | 32.8 | 3.3 | 0.041 WO$_{2.72}$ | 1.2 | — | 600 | 60 | 1185 |
| Example 15 | 49.2 | 47.7 | 3.0 | 0.037 WO$_{2.72}$ | 1.3 | — | 600 | 60 | 1185 |
| Example 16 | 49.3 | 47.8 | 3.0 | 0.003 WO$_3$ | 0.7 | — | 600 | 60 | 1185 |
| Example 17 | 65.3 | 29.7 | 5.0 | 0.041 WO$_{2.72}$ | 1.5 | — | 600 | 60 | 1185 |
| Example 18 | 62.6 | 32.5 | 4.9 | 0.041 WO$_{2.72}$ | 1.6 | — | 600 | 60 | 1185 |
| Example 19 | 48.1 | 47.4 | 4.4 | 0.037 WO$_3$ | 1.4 | — | 600 | 60 | 1185 |
| Example 20 | 58.7 | 28.6 | 12.7 | 0.040 WO$_3$ | 1.8 | — | 600 | 60 | 1185 |
| Example 21 | 56.2 | 31.2 | 12.5 | 0.039 WO$_3$ | 1.4 | — | 600 | 60 | 1185 |
| Example 22 | 42.8 | 45.7 | 11.4 | 0.036 WO$_3$ | 1.6 | — | 600 | 60 | 1185 |
| Example 23 | 56.2 | 28.1 | 15.6 | 0.039 WO$_3$ | 2 | 1200 | 600 | 60 | 1185 |
| Example 24 | 53.8 | 30.8 | 15.4 | 0.038 WO$_3$ | 1.5 | 1200 | 600 | 60 | 1185 |
| Example 25 | 40.8 | 45.1 | 14.1 | 0.035 WO$_3$ | 1.5 | 1200 | 600 | 60 | 1185 |
| Comparative Example 1 | 65.0 | 33.0 | 2.0 | 0.041 WO$_3$ | 3.5 | 550 | — | — | 1185 |
| Comparative Example 2 | 65.0 | 33.0 | 2.0 | 0.041 WO$_3$ | 3.5 | 1000 | — | — | 1185 |
| Comparative Example 3 | 65.0 | 33.0 | 2.0 | 0.041 WO$_3$ | 3.5 | — | — | — | 1185 |

TABLE 2

| | Element Content | | | | | Content of Crystal Phase | | | I Angle (°) | C-Plane (Å) | Amount of Bores (area %) |
|---|---|---|---|---|---|---|---|---|---|---|---|
| | In (atom %) | Zn (atom %) | W (atom %) | Zr (ppm) | Zn/W 比 | I (mass %) | IZ (mass %) | ZW (mass %) | | | |
| Example 1 | 97.3 | 2 | 0.7 | 15 | 2.9 | 98.2 | 0.9 | 0.9 | 50.83 | 33.53 | 1.5 |
| Example 2 | 81.3 | 18 | 0.7 | 15 | 25.7 | 85.8 | 13.2 | 0.9 | 50.88 | 33.53 | 0.6 |
| Example 3 | 79.3 | 20 | 0.7 | 15 | 28.6 | 84.2 | 14.8 | 0.9 | 50.89 | 33.54 | 1.2 |
| Example 4 | 67.3 | 32 | 0.7 | 15 | 45.7 | 74.1 | 25.0 | 1.0 | 50.89 | 33.55 | 1.5 |
| Example 5 | 96.8 | 2 | 1.2 | 15 | 1.7 | 97.9 | 0.6 | 1.5 | 50.85 | 33.54 | 1.2 |
| Example 6 | 80.8 | 18 | 1.2 | 15 | 15.0 | 85.5 | 12.9 | 1.6 | 50.92 | 33.54 | 0.6 |
| Example 7 | 78.8 | 20 | 1.2 | 15 | 16.7 | 83.9 | 14.5 | 1.6 | 50.92 | 33.55 | 1.2 |
| Example 8 | 66.8 | 32 | 1.2 | 15 | 26.7 | 73.7 | 24.6 | 1.7 | 50.9 | 33.57 | 1.4 |
| Example 9 | 96 | 2 | 2 | 19 | 1.0 | 97.5 | 0.1 | 2.5 | 50.89 | 33.6 | 1 |
| Example 10 | 96 | 2 | 2 | 110 | 1.0 | 97.5 | 0.1 | 2.5 | 50.9 | 33.61 | 1.1 |
| Example 11 | 88 | 10 | 2 | 25 | 5.0 | 91.4 | 6.0 | 2.6 | 50.9 | 33.6 | 1 |
| Example 12 | 80 | 18 | 2 | 45 | 9.0 | 85.0 | 12.3 | 2.7 | 50.94 | 33.6 | 0.6 |
| Example 13 | 80 | 18 | 2 | 19 | 9.0 | 85.0 | 12.3 | 2.7 | 50.94 | 33.6 | 0.6 |
| Example 14 | 78 | 20 | 2 | 25 | 10.0 | 83.4 | 13.9 | 2.7 | 50.94 | 33.6 | 1 |
| Example 15 | 66 | 32 | 2 | 19 | 16.0 | 73.1 | 24.1 | 2.8 | 50.92 | 33.59 | 1.2 |
| Example 16 | 66 | 32 | 2 | 2 | 16.0 | 73.1 | 24.1 | 2.8 | 50.91 | 33.59 | 1.2 |
| Example 17 | 79 | 18 | 3 | 25 | 6.0 | 84.4 | 11.6 | 4.0 | 50.99 | 33.65 | 0.6 |
| Example 18 | 77 | 20 | 3 | 25 | 6.7 | 82.7 | 13.2 | 4.0 | 50.99 | 33.67 | 1 |
| Example 19 | 65 | 32 | 3 | 25 | 10.7 | 72.4 | 23.4 | 4.2 | 50.95 | 33.62 | 1 |
| Example 20 | 74 | 18 | 8 | 25 | 2.3 | 81.1 | 7.9 | 11.0 | 51 | 33.71 | 0.6 |
| Example 21 | 72 | 20 | 8 | 25 | 2.5 | 79.4 | 9.6 | 11.1 | 50.99 | 33.72 | 0.8 |
| Example 22 | 60 | 32 | 8 | 25 | 4.0 | 68.6 | 19.9 | 11.5 | 50.96 | 33.7 | 0.9 |
| Example 23 | 72 | 18 | 10 | 25 | 1.8 | 79.7 | 6.4 | 13.9 | 51 | 33.82 | 0.6 |
| Example 24 | 70 | 20 | 10 | 25 | 2.0 | 78.0 | 8.1 | 14.0 | 51 | 33.84 | 0.8 |
| Example 25 | 58 | 32 | 10 | 25 | 3.2 | 67.1 | 18.4 | 14.5 | 51 | 33.8 | 0.8 |
| Comparative Example 1 | 78.8 | 20 | 1.2 | 15 | 16.7 | 83.9 | 0 | 0.8 | — | — | 2.1 |
| Comparative Example 2 | 78.8 | 20 | 1.2 | 15 | 16.7 | 83.9 | 0 | 2.5 | — | — | 2.7 |
| Comparative Example 3 | 78.8 | 20 | 1.2 | 15 | 16.7 | 83.9 | 0 | 0.6 | — | — | 4.3 |

TABLE 3

| | Arcing Frequency (times) | Mobility (350° C.) (cm²/Vs) | Mobility (450° C.) (cm²/Vs) | Mobility Ratio |
|---|---|---|---|---|
| Example 1 | 1 | 30 | 22 | 0.73 |
| Example 2 | 0 | 32 | 32 | 1.00 |
| Example 3 | 2 | 30 | 30 | 1.00 |
| Example 4 | 2 | 28 | 26 | 0.93 |
| Example 5 | 1 | 32 | 22 | 0.69 |
| Example 6 | 0 | 38 | 39 | 1.03 |
| Example 7 | 2 | 36 | 36 | 1.00 |
| Example 8 | 2 | 30 | 28 | 0.93 |
| Example 9 | 1 | 30 | 24 | 0.80 |
| Example 10 | 1 | 28 | 27 | 0.96 |
| Example 11 | 0 | 32 | 24 | 0.75 |
| Example 12 | 0 | 32 | 34 | 1.06 |
| Example 13 | 0 | 32 | 33 | 1.03 |
| Example 14 | 2 | 30 | 31 | 1.03 |
| Example 15 | 2 | 29 | 25 | 0.86 |
| Example 16 | 2 | 29 | 22 | 0.76 |
| Example 17 | 0 | 25 | 26 | 1.04 |
| Example 18 | 3 | 24 | 25 | 1.04 |
| Example 19 | 3 | 22 | 21 | 0.95 |
| Example 20 | 1 | 19 | 20 | 1.05 |
| Example 21 | 3 | 18 | 19 | 1.06 |
| Example 22 | 3 | 15 | 14 | 0.93 |
| Example 23 | 1 | 16 | 16 | 1.00 |
| Example 24 | 3 | 15 | 16 | 1.07 |
| Example 25 | 3 | 14 | 13 | 0.93 |
| Comparative Example 1 | 6 | 36 | 31 | 0.86 |
| Comparative Example 2 | 5 | 36 | 30 | 0.83 |
| Comparative Example 3 | 10 | 36 | 31 | 0.86 |

The oxide sintered material of each of Comparative Examples 1, 2 and 3 has the same composition (element content rate) as the oxide sintered material of Example 7, but does not contain the $Zn_4In_2O_7$ crystal phase (IZ crystal phase). As a result, compared with the semiconductor device (TFT) manufactured using the oxide sintered material of Example 7 as the sputtering target, the field-effect mobility of the semiconductor device (TFT) manufactured using the oxide sintered material of Comparative Examples 1, 2 and 3 as the sputtering target after the semiconductor device is subjected to the heat treatment (annealing) in nitrogen atmosphere under the atmospheric pressure at 450° C. for 10 minutes, which is the "mobility (450° C.)" is largely reduced.

Comparing Example 9 and Example 10, Example 12 and Example 13, and Example 15 and Example 16, it is found that these oxide sintered materials have the same contents of In, Zn and W but differ in the content of Zr. From the comparison of these Examples, it is understood that in order to maintain a high field-effect mobility when annealing at a high temperature, it is preferable to set the Zr content to 2 ppm or more and less than 100 ppm.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

10, 20, 30: semiconductor device (TFT); 11: substrate; 12: gate electrode; 13: gate insulating film; 14: oxide semiconductor film; 14c: channel part; 14d: drain electrode forming part; 14s: source electrode forming part; 15: source electrode; 16: drain electrode; 17: etch stopper layer; 17a: contact hole; 18: passivation film

The invention claimed is:

1. An oxide sintered material including an $In_2O_3$ crystal phase, a $Zn_4In_2O_7$ crystal phase and a $ZnWO_4$ crystal phase, wherein
    a diffraction angle 2θ at the X-ray diffraction peak derived from the $In_2O_3$ crystal phase is greater than 50.70° and smaller than 51.04°.

2. The oxide sintered material according to claim 1, wherein
    the content of the $In_2O_3$ crystal phase is 25 mass % or more and less than 98 mass %, and the content of the $Zn_4In_2O_7$ crystal phase is 1 mass % or more and less than 50 mass %.

3. The oxide sintered material according to claim 1, wherein
    the lattice constant of a C-plane of the $Zn_4In_2O_7$ crystal phase is 33.53 Å or more and 34.00 Å or less.

4. The oxide sintered material according to claim 1, wherein
    the content of the $ZnWO_4$ crystal phase is 0.1 mass % or more and less than 10 mass %.

5. The oxide sintered material according to claim 1, wherein
    the content of tungsten relative to the total of indium, tungsten and zinc in the oxide sintered material is more than 0.1 atom % and less than 20 atom %, and
    the content of zinc relative to the total of indium, tungsten and zinc in the oxide sintered material is more than 1.2 atom % and less than 40 atom %.

6. The oxide sintered material according to claim 1, wherein
    the content of zinc relative to the content of tungsten in the oxide sintered material is greater than 1 and less than 80 by atom ratio.

7. The oxide sintered material according to claim 1, further comprising zirconium, wherein
    the content of zirconium relative to the total of indium, tungsten, zinc and zirconium in the oxide sintered material is 0.1 ppm or more and 200 ppm or less by atom ratio.

8. A sputtering target comprising the oxide sintered material according to claim 1.

9. A method of manufacturing a semiconductor device including an oxide semiconductor film, comprising:
    preparing the sputtering target according to claim 8; and
    forming the oxide semiconductor film by a sputtering method using the sputtering target.

10. A method of producing an oxide sintered material according to claim 1, comprising:
    forming the oxide sintered material by sintering a molded body containing indium, tungsten and zinc,
    forming the oxide sintered material including placing the molded body at a first constant temperature selected from a temperature range of 500° C. or more and 1000° C. or less for 30 minutes or longer.

11. The method of producing an oxide sintered material according to claim 10, wherein
    forming the oxide sintered material includes placing the molded body at the first temperature for 30 minutes or longer, and placing the molded body in an oxygen-containing atmosphere at a second temperature which is 800° C. or more and less than 1200° C. and higher than the first temperature in this order.

12. A method of producing an oxide sintered material according to claim 1, comprising:
    preparing a primary mixture of a zinc oxide powder and an indium oxide powder;

forming a calcined powder by heat-treating the primary mixture;

preparing a secondary mixture of raw powders including the calcined powder;

forming a molded body by molding the secondary mixture; and forming the oxide sintered material by sintering the molded body, forming the calcined powder including forming a complex oxide powder including zinc and tungsten as the calcined powder by heat-treating the primary mixture at a temperature of 550° C. or more and less than 1300° C. in an oxygen-containing atmosphere.

13. The method of producing an oxide sintered material according to claim 12, wherein forming the oxide sintered material includes placing the molded body at a first constant temperature selected from a temperature range of 500° C. or more and 1000° C. or less for 30 minutes or longer.

14. The method of producing an oxide sintered material according to claim 13, forming the oxide sintered material includes placing the molded body at the first temperature for 30 minutes or longer, and placing the molded body in an oxygen-containing atmosphere at a second temperature which is selected from a temperature range of 800° C. or more and less than 1200° C. and higher than the first temperature in this order.

* * * * *